United States Patent [19]
Ogata

[11] Patent Number: 5,278,809
[45] Date of Patent: Jan. 11, 1994

[54] PHOTOMAGNETIC RECORDING APPARATUS RECORDING WITH ALTERNATING MAGNETIC FIELD AND D.C. MAGNETIC FIELD

[75] Inventor: Takashi Ogata, Hachioji, Japan

[73] Assignee: Olympus Optical Co., Ltd., Tokyo, Japan

[21] Appl. No.: 641,371

[22] Filed: Jan. 15, 1991

[30] Foreign Application Priority Data

Jan. 17, 1990 [JP] Japan ............................ 2-9131
May 2, 1990 [JP] Japan ............................ 2-116114

[51] Int. Cl.$^5$ .................... G11B 13/04; G11B 11/10; G11B 11/12
[52] U.S. Cl. ........................ 369/13; 360/114
[58] Field of Search ............ 369/13, 14; 360/59, 360/114, 66

[56] References Cited

U.S. PATENT DOCUMENTS

| | | | |
|---|---|---|---|
| 4,712,203 | 12/1987 | Saito et al. | 360/59 |
| 4,907,211 | 3/1990 | Horimai et al. | 360/59 |
| 4,937,882 | 6/1990 | Omori et al. | 369/13 |
| 4,959,820 | 9/1990 | Horimai et al. | 369/13 |
| 5,121,369 | 6/1992 | Makansi | 369/13 |

FOREIGN PATENT DOCUMENTS 63-37842 2/1988 Japan .
63-94406 4/1988 Japan .
63-152047 6/1988 Japan ............................ 360/114

Primary Examiner—Hoa T. Nguyen
Attorney, Agent, or Firm—Armstrong, Westerman, Hattori, McLeland & Naughton

[57] ABSTRACT

A photomagnetic recording apparatus, which has an optical head which has a light beam generating device for generating a fixed intensity light beam, and an optical system for condensing and irradiating the light beam onto a photomagnetic recording medium. The optical head is arranged on a first side of the medium. A recording magnetic biasing field generating device is arranged on the second side opposite to the first side of the medium. The device includes a first magnetic field generating device having a series resonant circuit having a head coil and a capacitor connected in series to each other. A driving signal feeding device feeds the series resonant circuit with an exciting signal synchronized with the resonant frequency of the series resonant circuit, to generate a first magnetic field to the medium. A suppressing controlling device is connected to the series resonant circuit for suppressing or non-suppressing the resonant characteristic of the series resonant circuit in accordance to a recording signal corresponding to recorded information, by suppressing or non-suppressing the current flowing through the coil. A second magnetic field generating device generates a second D.C. magnetic field, directed reversely to the direction of the first generated magnetic field.

57 Claims, 14 Drawing Sheets

FIG.1 (PRIOR ART)
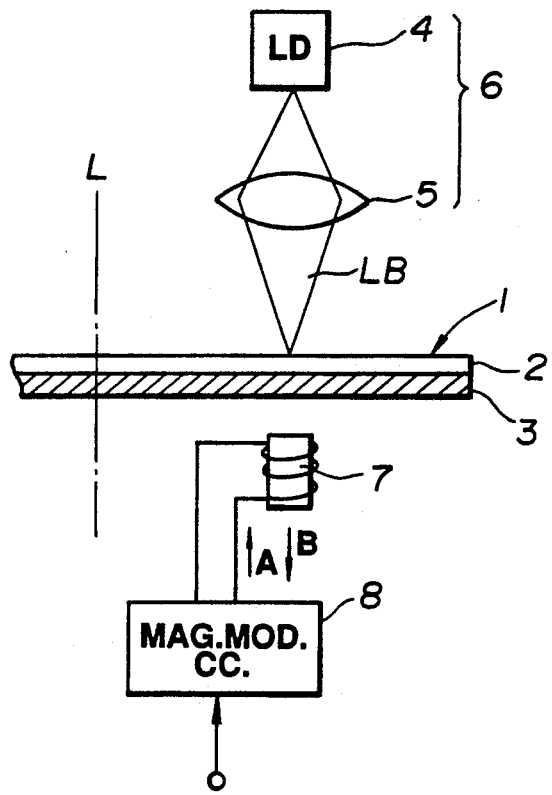
(PRIOR ART)
FIG.2A REC. SIG.
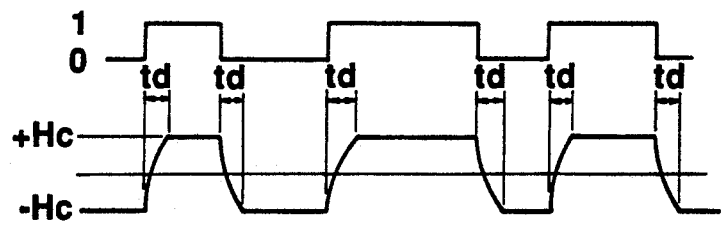
FIG.2B MAG. FIELD
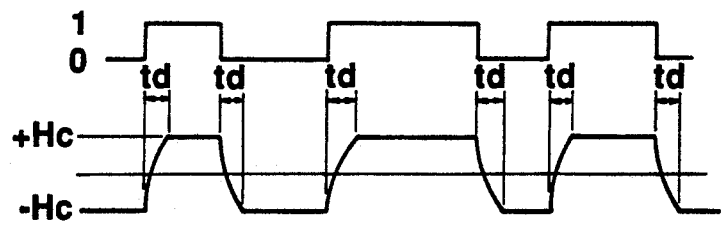
FIG.2C L.LIGHT LB
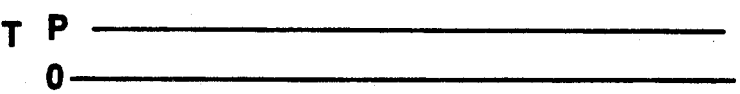
FIG.2D REC. PATTERN
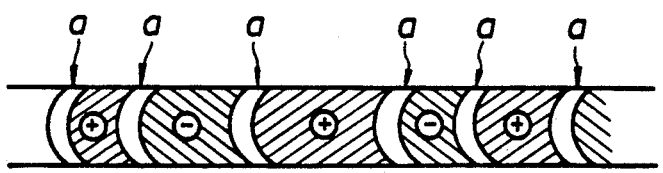

FIG.3 (PRIOR ART)
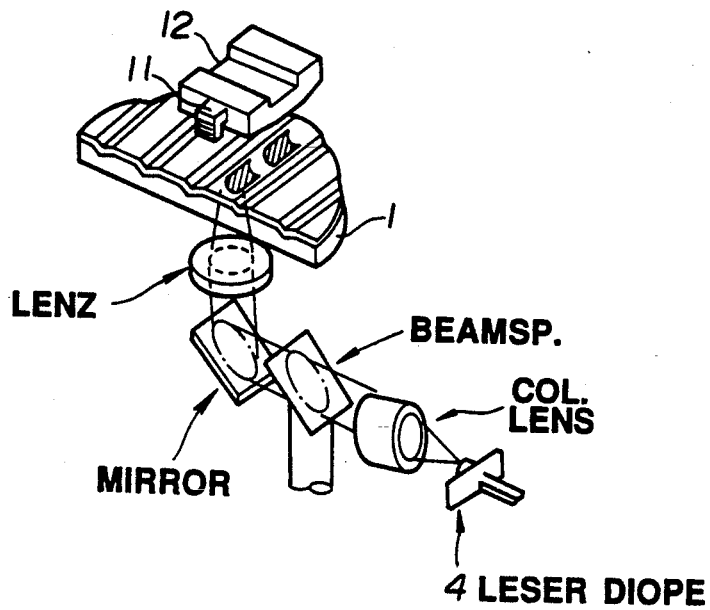
FIG.4 (PRIOR ART)
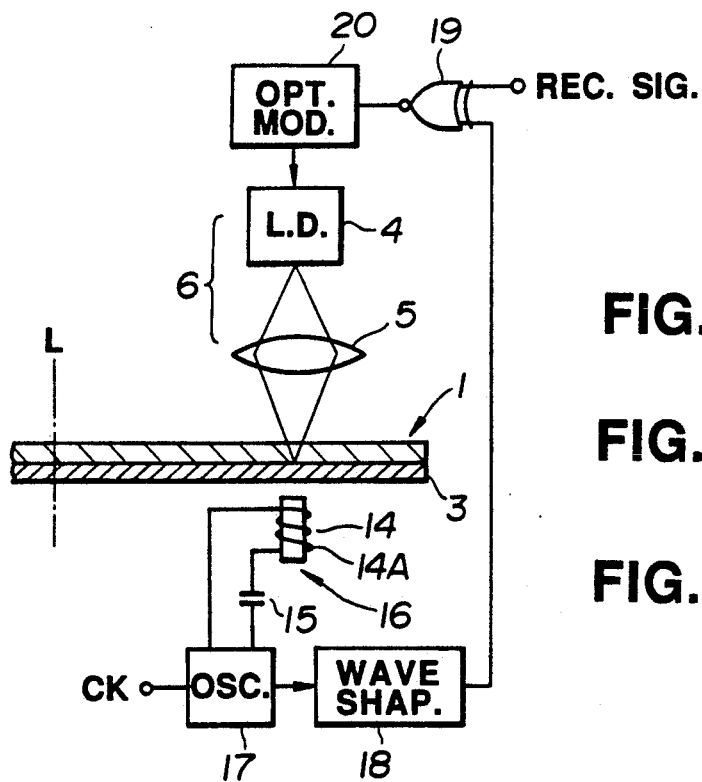
(PRIOR ART)
FIG.5A
FIG.5B
FIG.5C FIG. 6
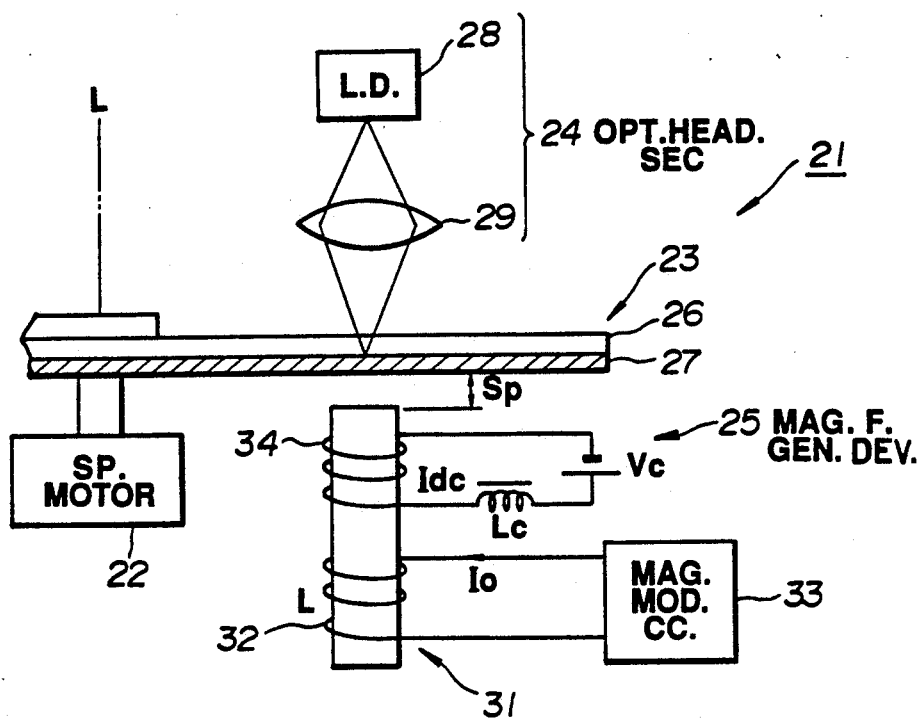
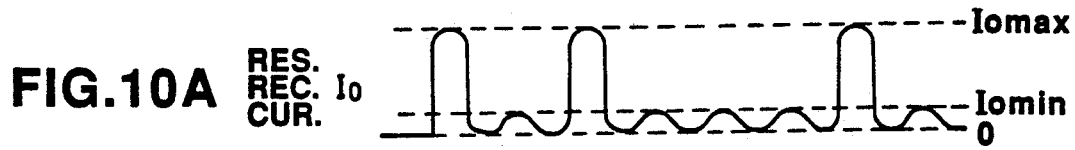
FIG. 10A  RES. REC. Io CUR.
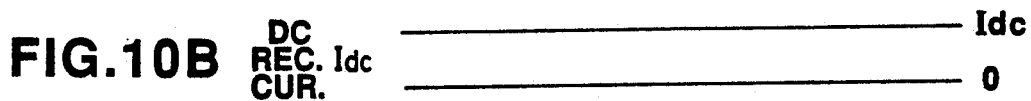
FIG. 10B  DC REC. Idc CUR.
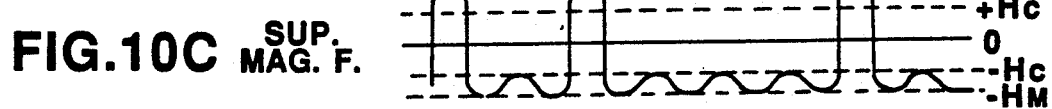
FIG. 10C  SUP. MAG. F.
FIG. 10D  REC. PAT.

FIG.9A
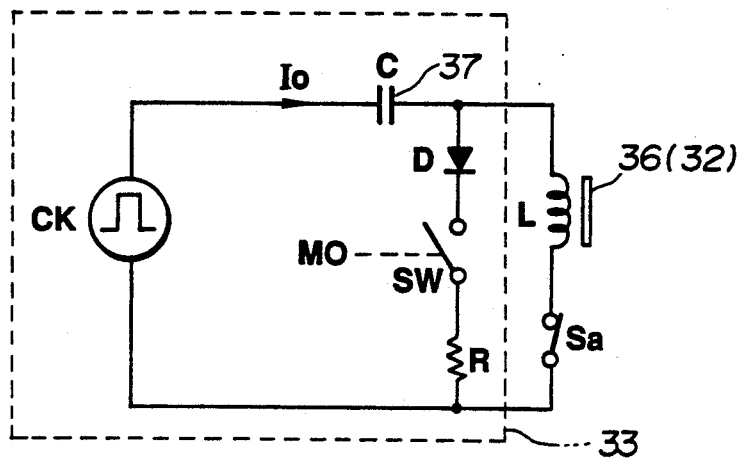
FIG.9B
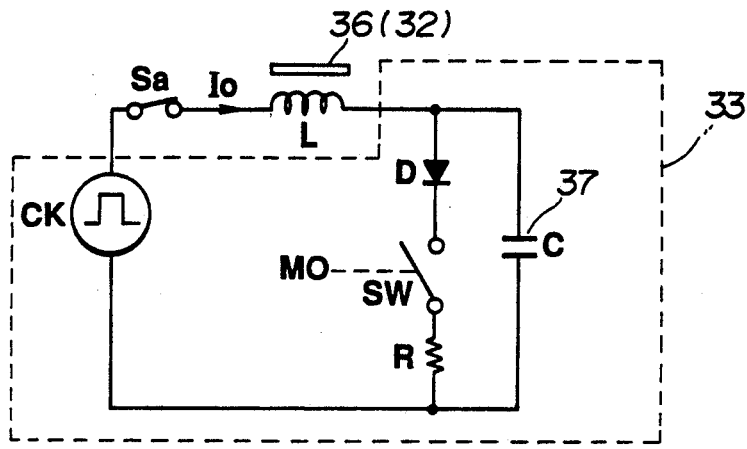
FIG.11A CLOCK SIG. CK
FIG.11B MOD. SIG. MO
FIG.11C RES. CUR. Io
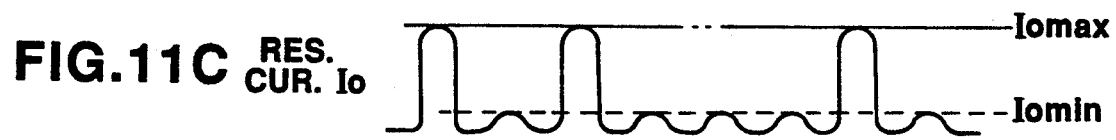

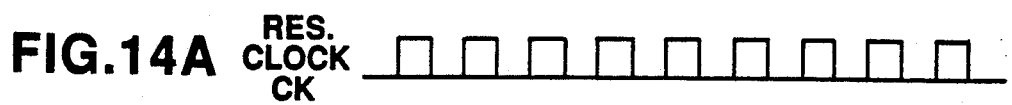
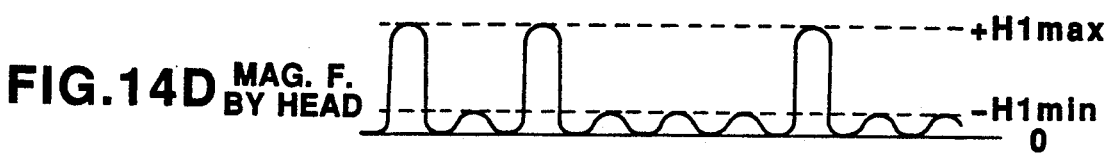
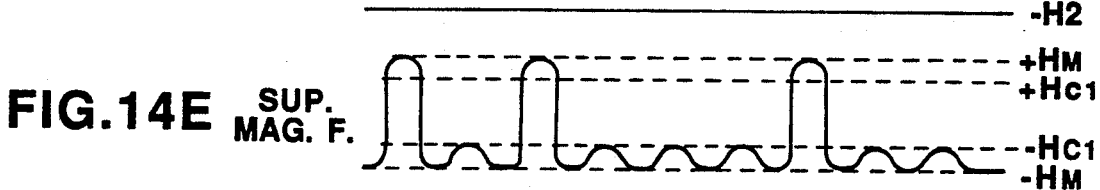
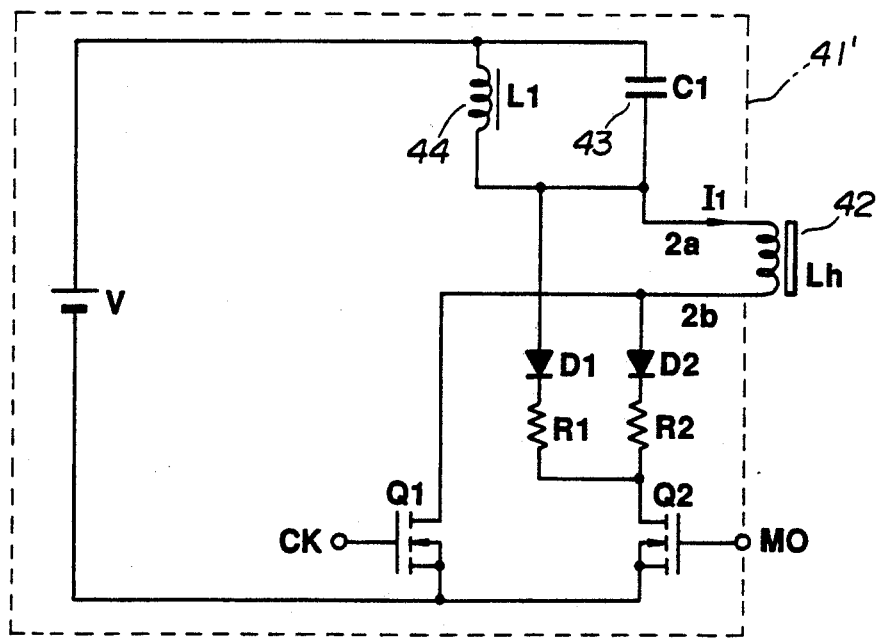

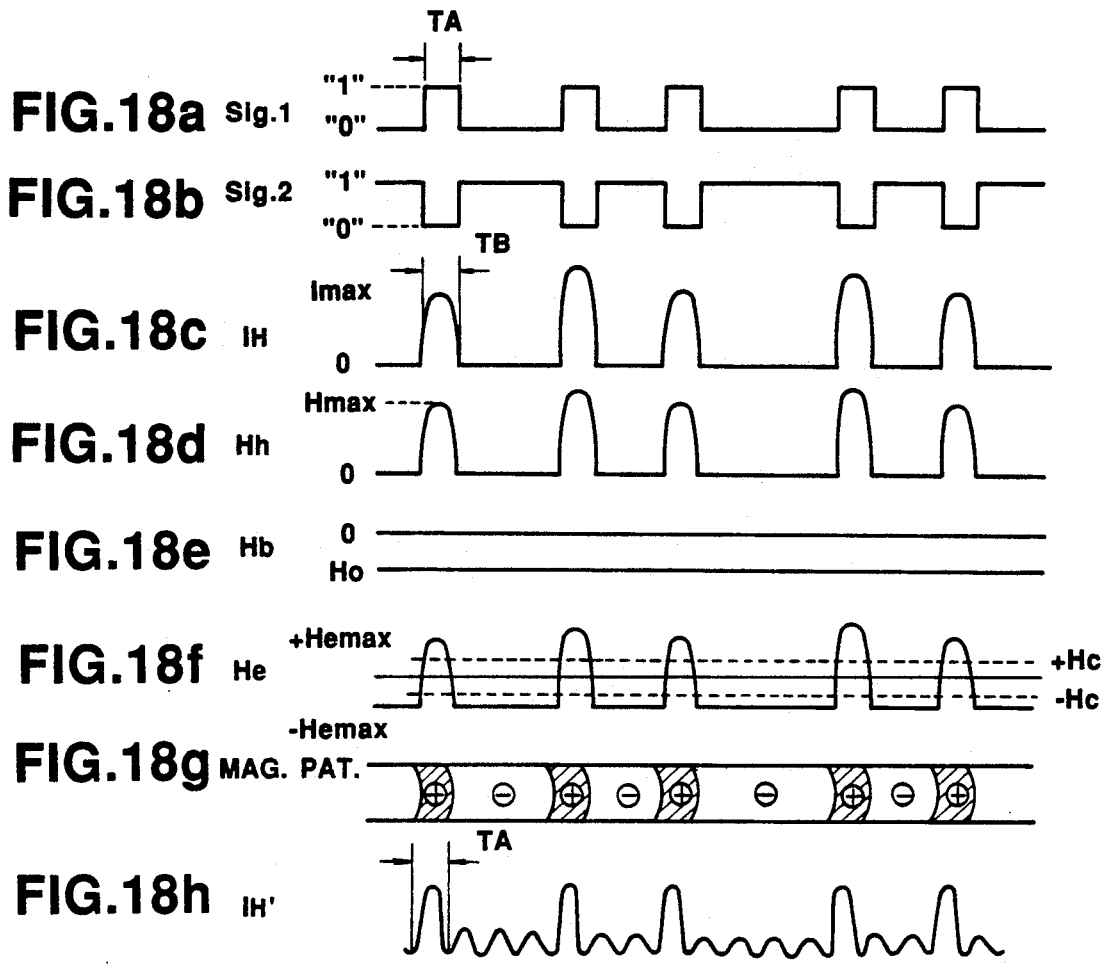
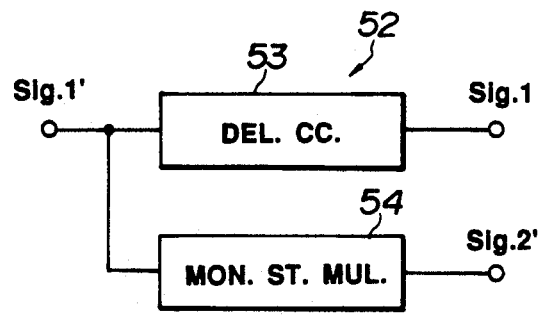

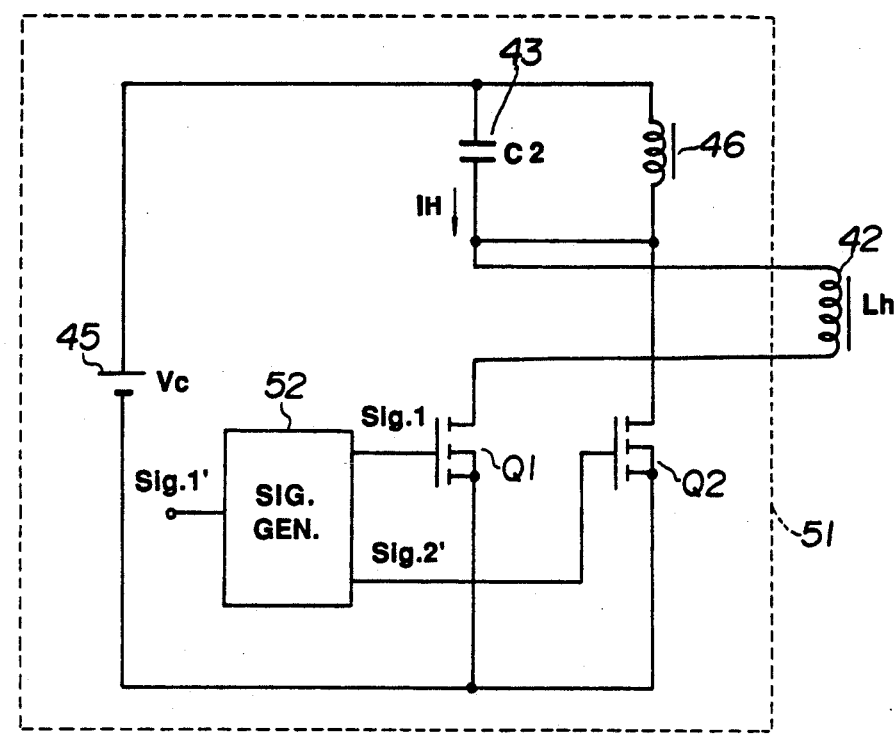

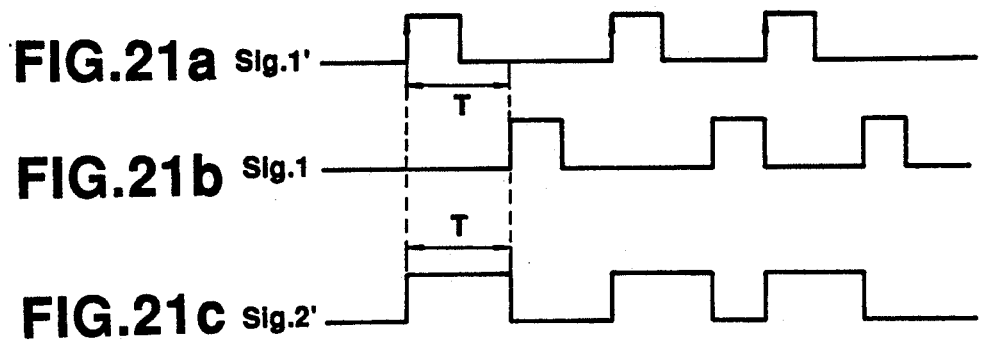
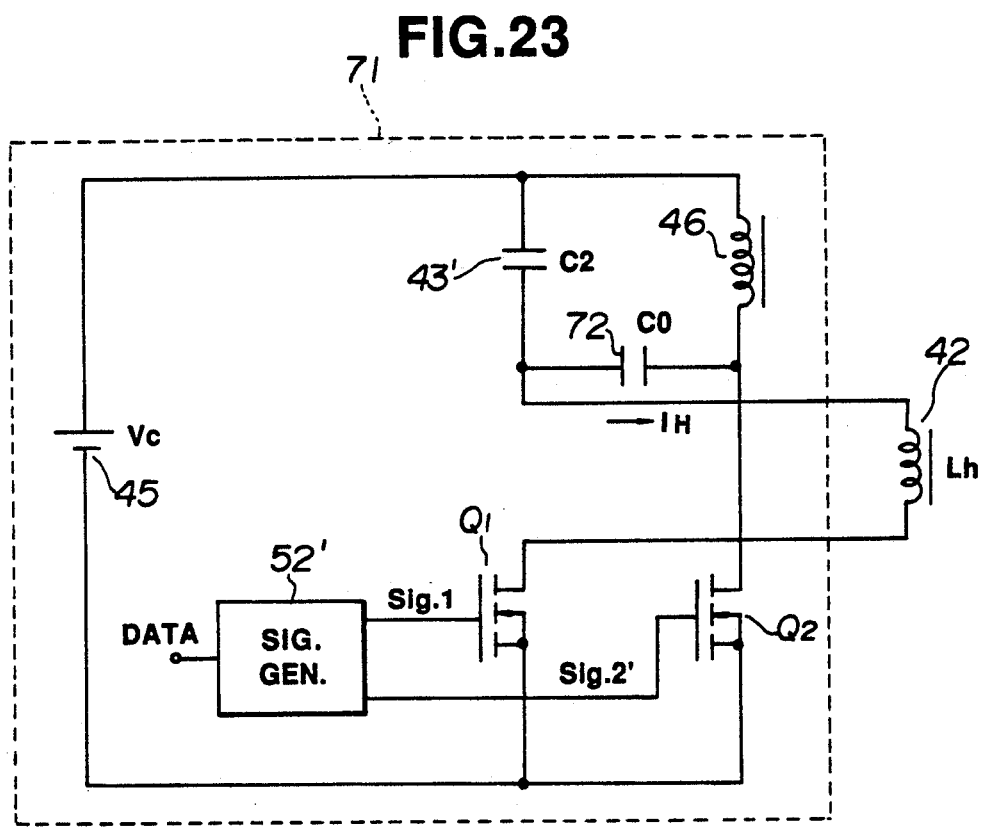

FIG.25a DATA

FIG.25b Sig.1

FIG.25c Sig.2

FIG.28
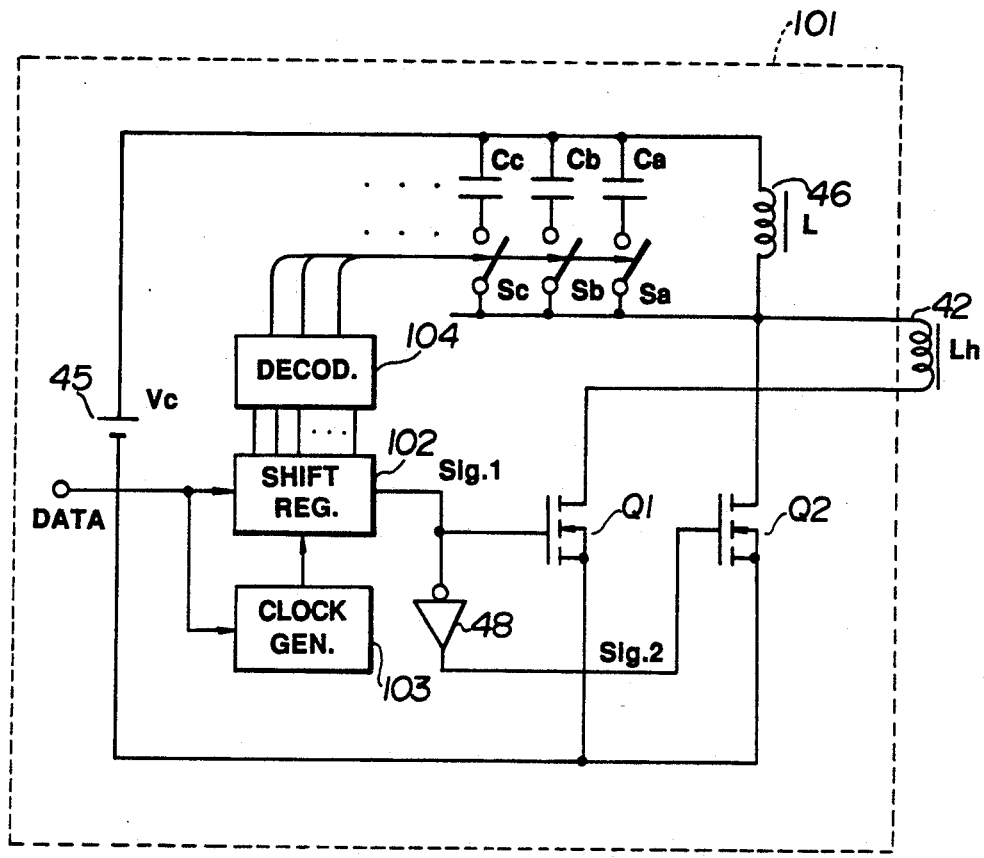
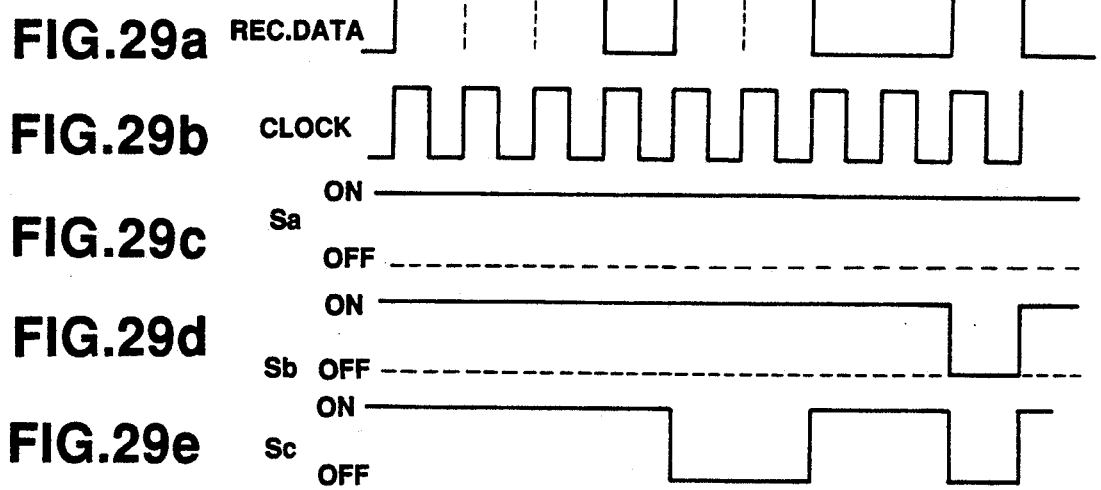
FIG.29a REC.DATA
FIG.29b CLOCK
FIG.29c Sa
FIG.29d Sb
FIG.29e Sc

PHOTOMAGNETIC RECORDING APPARATUS RECORDING WITH ALTERNATING MAGNETIC FIELD AND D.C. MAGNETIC FIELD

BACKGROUND OF THE INVENTION

Field of the Invention and Related Art Statement

This invention relates to a photomagnetic recording apparatus of a magnetic field modulating system which can make over writing on a photomagnetic recording medium.

Recently, there has been practiced an optical recording/reproducing apparatus which can record and reproduce information at a high recording density.

In the above mentioned optical recording/reproducing apparatus, a recording/reproducing apparatus of a photomagnetic system utilizing a photomagnetic phenomenon has a merit that the written information can be erased and again written in and therefore can be used instead of a recording/reproducing apparatus of a magnetic system using such magnetic head as a hard disc.

In the recording system utilizing a photomagnetism, a magnetic field modulating system of such principle as is shown in FIG. 1 is known as an over writing system simultaneously making erasing and recording.

In FIG. 1, the reference numeral 1 represents a photomagnetic disc. In this prior art example, the photomagnetic disc 1 is formed by coating a resin substrate 2 with a vertically magnetized film 3 and is rotated with the axis L as a center. The reference numeral 6 represents an optical head section radiating a laser light to the vertically magnetized film 3 of the photomagnetic disc. This optical head section 6 is Provided with a semiconductor laser device 4 and focusing lens 5 and can be moved in the radial direction of the photomagnetic disc 1 while keeping a predetermined distance from the surface of the photomagnetic disc 1. An electromagnet 7 is placed in a position opposed to this optical head section 6 through the photomagnetic disc 1 so as to be able to apply a magnetic field to the vertically magnetized film 3 of the photomagnetic disc 1 and can be moved in the radial direction of the photomagnetic disc 1 as operatively connected with the optical head section 6. There is also provided a magnetic field modulating circuit 8 for modulating with recorded data the magnetic field generated by the electromagnet 7 so that, for example, in response to "1" or "0" of the recording signal, the direction of the electric current flowing through the electromagnet may be changed to be in the direction of the arrow A or B and the direction for the photomagnetic disc 1 of the generated magnetic field may be varied.

In the photomagnetic recording apparatus of the thus formed prior art example, as shown, for example, in FIG. 2A, when a recording signal is input into the magnetic field modulating circuit 8, such magnetic field as is shown in FIG. 2B will be generated in the electromagnet 7 and will be applied to the vertically magnetized film 3 of the photomagnetic disc 1. As a result of radiating a laser light of a fixed intensity P which can make the temperature of the vertically magnetized film 3 of the photomagnetic disc 1 above the Curie point as shown in FIG. 2C, such recording pattern as is shown in FIG. 2D will be typically formed in the recording track of the vertically magnetized film 3 of the photomagnetic disc 1. In this FIG. 2D, the marks (+) and (−) represent respectively the states magnetized upwardly and downwardly with respect to the vertically magnetized film surface. Thus, in the photomagnetic recording apparatus of the prior art example, while the minute part of the vertically magnetized film 3 of the photomagnetic disc 1 is being continuously heated to be above the Curie point, the rotary axis L is moved to the center, the magnetic field modulated in response to the recording signal is applied to magnetize the part having become near the Curie point and, when the temperature falls, the magnetization will be held to make photomagnetic recording. According to this system, recording can be made by over writing new informatiion on already recorded magnetized information.

In the photomagnetic recording apparatus adopting the magnetic field modulating system of the above mentioned prior art example, in case the magnetic field applied to the vertically magnetized film 3 of the photomagnetic disc 1 turns its direction in response to the variation of the signal level of the recording signal, such turning time td as is shown in FIG. 2B will be required. When the value of td is large, during this turning time td, the magnetic field of an intensity $|\pm Hc|$ required to orient the magnification in the magnetic field direction will not be applied to the vertically magnetized film 3 but a laser light of a fixed intensity P will be continuously radiated to it and therefore, on the recording track pattern corresponding to the magnetic field turning time td, as shown by the reference symbol a in FIG. 2D, a region in which the direction of the magnetic field is not defined will be made and a noise region likely to cause an error at the time of reproduction will be generated. Here, the turning time td is such that, when the inductance of the magnetic head coil is represented by L, the electric current flowing through the coil is represented by I and the voltage applied to the coil at both ends is represented by V, if the coil is assumed to be made of only a pure inductance component, the relation of $td = LI/V$ will be established.

On the other hand, if the number of coils of the head is represented by N, the generated magnetic field Ho of the head will be proportional to NI ($Ho \propto NI$) and the inductance L of the head will be proportional to $N^2$ ($L \propto N^2$). Therefore, in order to apply a fixed magnetic field to the photomagnetic disc 1 apart by a fixed distance Sp from the magnetic head, as the number N of coils and current I relating to Ho can not be made smaller, the product LI will be constant. In order to reduce the turning time td while securing the fixed magnetic field Ho, the applied voltage V will be made larger and there will be a problem that the power consumption of the magnetic field driving circuit and magnetic head coil will increase. Also, in the case of connecting a resistance in series with the coil, if the resistance value of the resistance is represented by R, td will be given by $td = L/R$. Therefore, in this case, too, in order to make td smaller, R will have to be made larger and there will be a problem that the power consumption in the resistance will increase.

Particularly, in the case of a high density recording, it will be necessary to make the turning time td further smaller. If the applied voltage V is made larger for that purpose, the power consumption will further increase and the heat generation by the loss in the magnetic head coil and the driving circuit driving the head will become so large as to make the high density recording difficult.

For example, when the heat generation in the above mentioned magnetic head coil becomes larger, the insulating film of the magnetic head coil will be thermally broken to short-circuit, the magnetic characteristic of the core of the magnetic head will deteriorate, the heat will raise the temperature of the photomagnetic disc 1 and a stable recording will be no longer be made. That is to say, in the magnetic field modulating system, as the direction of the magnetic field varies in response to the recording signal, after the beam spot is irradiated, the magnetization of the magnetized film will have to be quickly defined. For this purpose, after the beam spot is irradiated, the irradiated part of the spot will have to be quickly cooled and therefore, if there is a factor of raising the temperature of the photomagnetic disc 1, no stable recording will be able to be made.

Therefore, as disclosed in Japanese Patent Application Laid Open No. 37842/1988, there is conceived a method of modulating a laser light by applying a magnetic field at a fixed frequency under a resonant condition. In this method, as a magnetic field of a fixed frequency is applied under a resonant condition, the current flowing through the magnetic head winding will be determined by inductance L of the magnetic head and the turning time td will become smaller but, due to the resonant circuit, the modulating signal over a wide frequency range will not be able to be recorded and, after all, the light will be modulated as synchronized with the magnetic field variation. Therefore, in this system, a light regulating circuit is necessary, an applying timing of the light and magnetic field and a controlling mechanism for combining the light spot position on the disc and the magnetic field applying region are necessary and there has been a problem that the formation is more complicated than of a magnetic field modulating system of a simple formation.

On the other hand, the prior art example shown in FIG. 3 is of a system using a floating type magnetic head 11. In this system, a magnetic head 11 is made small and is integral with a slider 12 so that the magnetic head 11 together with the slider 12 may be floated up several μm above the disc 1 by utilizing the pressure by the air stream flowing below the slider 12 when the photomagnetic disc 1 is rotated and the magnetic field may be thereby applied to the photomagnetic disc 1 to record the magnetic field modulation. According to this system, as the distance between the magnetic head 11 and disc is so short as to be several μm, the intensity of the magnetic field generated from the magnetic field generating coil can be made small, the magnetic field region applied to the disc can be also made narrow, therefore the exciting current and inductance can be made smaller than that of a magnetic head of a non-floating type (mentioned as a fixed type) and therefore there is an advantage that the high density recording turning the magnetic field at a high speed becomes easy.

However, in this system, as the distance between the magnetic head 11 and photomagnetic disc 1 is so short as to be several μm, there is a problem that, when the magnetic head 11 and disc 1 contact with each other, the disc 1 surface and head 11 will be damaged or the head 11 and disc 1 will be attracted to each other by moisture or the like and the advantage of the non-contact recording which is a feature of the light recording will be impaired. Also, there are problems that, in order that the magnetic head 11 may be floated above the disc 1 and may be maintained at a height of several μm, the shape of the slider 12 of the head 11 must be worked so precisely as to be adapted to floating up, a supporting mechanism for stably supporting the slider 12 against the air pressure is necessary and the floating type head 11 is more complicated in the structure and higher in the cost than the fixed type head.

Also, the Prior art example shown in FIG. 4 and disclosed in Japanese Patent Application Laid Open No. 37842/1988 is of a system of making recording with a fundamental light modulating system wherein a resonant circuit is formed of an inductor of a magnetic head winding and a externally fitted condenser, a fixed frequency magnetic field is generated from the magnetic head under a resonant condition and a light pulse modulated in response to recorded data by the direction of a magnetic field applied onto a disc is radiated to the disc as synchronized with the magnetic field variation.

In this system, a condenser 15 is connected in series with a coil 14A of an electromagnet 14 to form a resonant circuit 16 and an oscillating circuit 17 having the coil 14A of the electromagnet 14 as an oscillating coil is provided.

In this case, the value C of the condenser 15 is set so that the resonant frequency f0 of this resonant circuit 16 may be a frequency 2 fm twice as high as the highest frequency fm of the recording signal and a magnetic field in which the direction is turned at the frequency 2 fm is generated by the electromagnet 14.

The oscillating signal obtained by an oscillating circuit 17 is fed to one input end of a coinciding circuit 19 through a waveform shaping circuit 18 and the recording signal input into the other record input end is fed to a light modulator 20.

In this system, as the exciting current of the magnetic head is flowed under a resonant condition, even if the inductance of the head is large, a large current of a high frequency will be able to be given to the head winding and, as a result, even in a fixed type head in which the magnetic head is separated by more than 100 μm from the disc, a magnetic field large enough to magnetize a medium turning at a high speed as shown in FIG. 5A will be able to be generated and, when such modulated laser pulse as is shown in FIG. 5B is radiated by the direction, such magnetizing pattern as is shown in FIG. 5C will be able to be formed and recorded on the vertically magnetized film 3 of the disc 1.

According to this system, as the light modulation is recorded while the magnetic field is being varied at a high speed by using a magnetic head fixed as separated from a disc, over writing which has been impossible with an ordinary light modulating system giving a fixed magnetic field is possible and the problems of the floating type magnetic head can be solved. In this system, in addition to the mechanism of varying the magnetic field, a light modulating circuit combining the variation of the magnetic field and timing is required and therefore there is a problem that the structure is more complicated than of the general magnetic field modulating system.

OBJECTS AND SUMMARY OF THE INVENTION

An object of the present invention is to provide a photomagnetic recording apparatus which makes it possible to record a magnetic field modulation at a high density with a simple formation without requiring a light modulating means.

Another object of the present invention is to provide a photomagnetic recording apparatus whereby the rise of a generated magnetic field for recording can be made short and a magnetic field modulation can be recorded at a high speed.

Further another object of the present invention is to provide a photomagnetic recording apparatus whereby the power consumption in a recording magnetic field generating apparatus can be made small and the C/N of a reproduced output even in a high density record can be made large.

The photomagnetic recording apparatus of the present invention comprises a first magnetic field generating means for generating a bias magnetic field having a polarity in the first direction, a second magnetic field generating means formed of a series resonant circuit which has a polarity in the second direction and is of a single frequency and in which the amplitude of the magnetic field varies in response to the recorded data and a light radiating means for radiating a condensable light of a predetermined intensity to a photomagnetic recording medium so that, while a large magnetic field turning at a high speed by the above mentioned series resonant circuit is applied to a photomagnetic recording medium, by modulating and controlling the amplitude with recorded data, even in case the inductance is large, even if the speed is high and the distance between the recording head and recording medium is large, recording by a magnetic field modulation may be made at a high density.

Also, the photomagnetic recording apparatus of the present invention comprises:

a light head having a light beam generating means for a condensable light beam and an optical system condensing the above mentioned light beam and irradiating a recording medium of a photomagnetic system with a light beam of a fixed intensity;

a recording magnetic field generating means having a series resonant circuit consisting of a recording head coil arranged as opposed to the above mentioned recording medium and an electrostatic capacity connected in series with said head coil, a power source of a partial polarity connected in series with the above mentioned series resonant circuit through a first switching means, an inductor connected in parallel with the above mentioned electrostatic capacity and having an inductance sufficiently larger than the inductance of the above mentioned head coil, a second switching means provided in parallel with the above mentioned series head coil and first switching means and a controlling means for controlling the switching operation of the above mentioned first and second switching means with a recording signal corresponding to the resonant frequency of the above mentioned series resonant circuit; and a bias magnetic field generating means for generating a bias magnetic field in a direction reverse to the direction of the magnetic field generated by the above mentioned recording magneric field generating means;

so that, when the above mentioned respective switching means are operated in response to a recording signal and a resonant current is flowed through the head coil under a resonant condition, without esorting to the inductor, the rising time of the generated magnetic field of the head will be short and the power consumption in the exciting circuit will be able to be made small.

BRIEF DESCRIPTION OF THE DRAWINGS

FIG. 1 is a formation view of a prior art example.

FIGS. 2(A-D) is an operation explaining view of FIG. 1.

FIG. 3 is a perspective view of another prior art example.

FIG. 4 is a formation view of further another prior art example.

FIGS. 5(A-C) is an operation explaining view of FIG. 4.

FIGS. 6 to 11 relate to the first embodiment of the present invention.

FIG. 6 is a schematic formation view of a photomagnetic recording and reproducing apparatus of the first embodiment.

FIG. 7 is a formation view showing the optical system and others of a light head part.

FIG. 8 is an explanatory view showing light outputs in a reproducing mode and recording mode.

FIG. 9A is a circuit diagram of a magnetic field modulating circuit.

FIG. 9B is another embodiment of the circuit diagram of FIG. 9A.

FIGS. 10A-10D are explanatory views of waveforms of a recording operation.

FIGS. 11A-11C are explanatory views of the circuits of FIGS. 9A and 9B.

FIGS. 14A-14F are explanatory views of the operation of the second embodiment.

FIG. 15 is a circuit diagram of a magnetic field modulating circuit in the third embodiment of the present invention.

FIGS. 16 to 18 relate to the fourth embodiment of the present invention.

FIG. 16 is a schematic formation view of a photomagnetic recording and reproducing apparatus of the fourth embodiment.

FIG. 17 is a circuit diagram of a magnetic field modulating circuit.

FIGS. 18A-18H are explanatory views of the operation of FIG. 17.

FIGS. 19 to 22 relate to the fifth embodiment of the present invention.

FIG. 19 is a circuit diagram of a magnetic field modulating circuit.

FIG. 20 is a formation view of a signal producing circuit.

FIGS. 21A-21C are explanatory views of the operation of FIG. 20.

FIGS. 22A-22C are explanatory views of the operation of FIG. 19.

FIGS. 23 to 25 relate to the sixth embodiment of the present invention.

FIG. 23. is a circuit diagram of a magnetic field modulating circuit.

FIG. 24 is a formation view of a signal producing circuit.

FIGS. 25A-25F are explanatory views of the operation of FIG. 23.

FIGS. 28 and 29 relate to the ninth embodiment of the present invention.

FIG. 28 is a circuit diagram of a magnetic field modulating circuit.

FIGS. 29A-29E are explanatory views of the operation of FIG. 28.

DETAILED DESCRIPTION OF PREFERRED EMBODIMENTS

Figure 7:
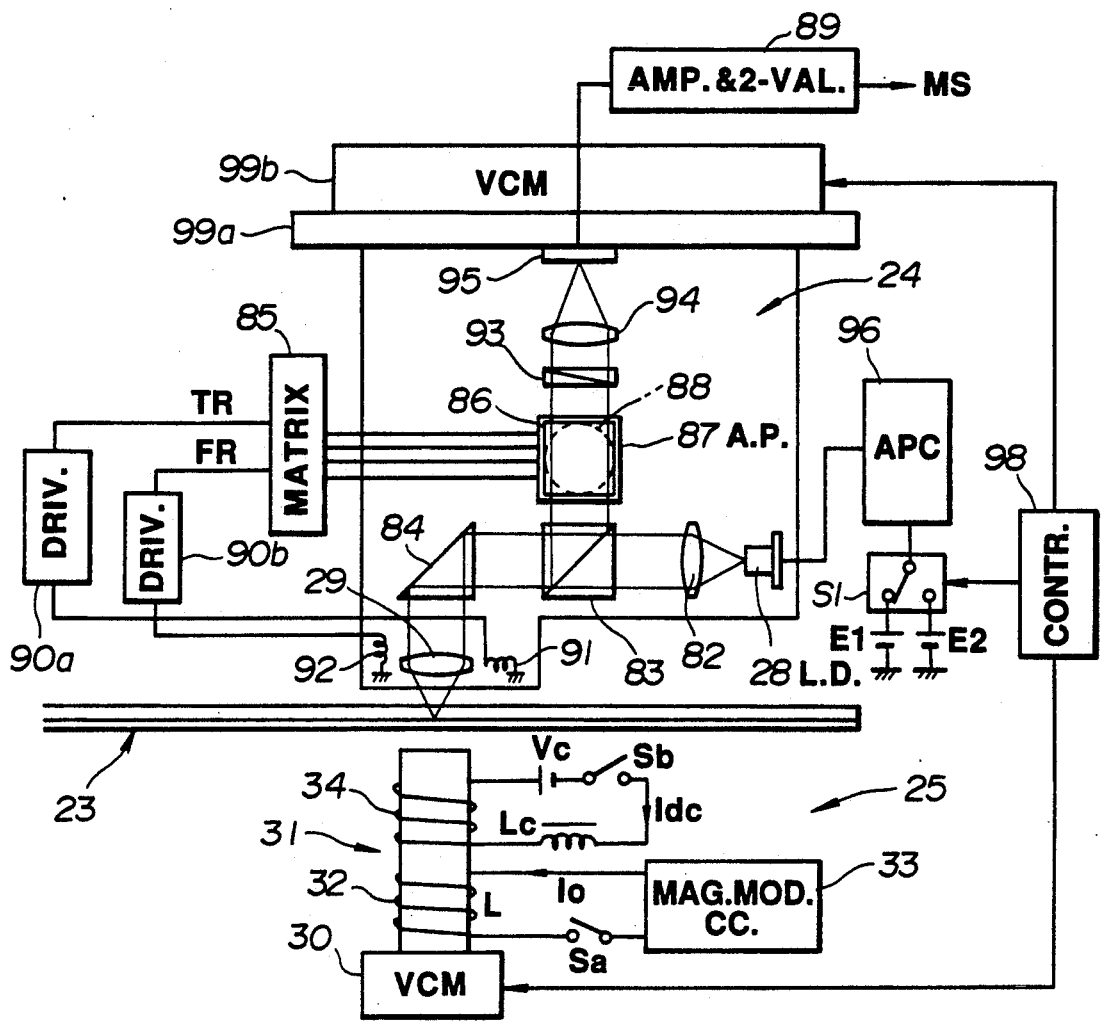

As shown in FIG. 6, in a photomagnetic recording and reproducing apparatus 21 of a magnetic field modulating system of the first embodiment, an optical head section 24 and recording magnetic field generating device (mentioned also as a magnetic head driving circuit) 25 are arranged as opposed to the respective surfaces of a disc-like photomagnetic disc 23 rotated and driven with the center axis L as a center by a spindle motor 22.

The above mentioned photomagnetic disc 23 is formed by coating a transparent substrate 26 with a vertically magnetized film 27 so that a laser light of a laser diode (semiconductor laser) 28 may be condensed through an objective lens 29 and may be radiated to the vertically magnetized film 27.

The optical system of this optical head section 24 is shown in FIG. 7.

Light beams generated by the laser diode 28 generating a condensable light are made parallel beams from diffusing light beams and are then input into a beam splitter 83 and some of them are transmitted, are input into an all reflecting mirror 84, are all reflected, are condensed by the objective lens 29 and are radiated to the photomagnetic disc 23 to form a beam spot.

The light reflected by this photomagnetic disc 23 proceeds to the beam splitter 83 through the objective lens 29 and all reflecting mirror 84 and a part of it is reflected and is divided into a transmitted light and reflected light by a second beam splitter 86.

The reflected light is used to produce a control signal (servosignal) and the transmitted light is used to reproduce information in a reproducing mode.

That is to say, the reflected light is received by a light detector 88 of four divisions through a critical angle prism 87 arranged in the direction vertical to the paper surface in FIG. 7 and a track error signal TR and focus error signal FR are produced by a signal photoelectrically converted by this light detector 88 and treated to be added or subtracted in a matrix circuit 85, are fed respectively to a tracking coil 91 and focusing coil 92 forming a lens actuator through a phase compensating circuit not illustrated and driving circuits 90a and 90b respectively and are controlled so that a beam spot irradiated to the photomagnetic disc 23 through the objective lens 29 may be in a tracking state following an object track and a focusing state in which the light beam spot is smallest.

On the other hand, only the light component in one polarizing direction Kerr-rotated by a magnetic Kerr effect of the transmitted light is transmitted by the light detector 93, is condensed by a condensing lens 94 and is received by a light detector 95 and its photoelectrically converted output signal is amplified and divalued by an amplifying and divaluing circuit 89 to produce a reproduced signal MS corresponding to the direction of the magnification of the photomagnetic disc 23.

The above mentioned laser diode 28 is automatically controlled in the light beam emitting power by an APC circuit 96.

Figure 8:
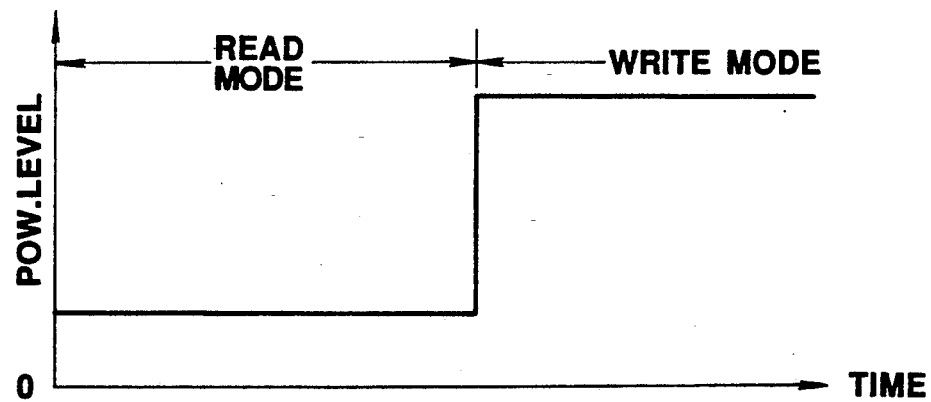

In this laser diode 28, reference levels E1 and E2 to be automatically controlled are switched over to each other by switching a controlling power switching switch S1 of the APC circuit 96. For example, the reproducing mode (mentioned also as a reading mode) is controlled to be of a low emitting power value corresponding to the reference level E1 smaller than the reference level E2 (See FIG. 8) and the recording mode (mentioned also as a writing mode) is controlled to be of a high emitting power value. By the way, the switching switch S1 is switched in response to the reproducing mode and recording mode by a controller 98.

In the photomagnetic recording and reproducing apparatus of this magnetic field modulating system, even in the recording mode, the emitting power is not modulated by the modulating signal for recording but is retained to be a fixed power (but the power value is different) the same as in the reproducing mode.

That is to say, even in the recording mode, the laser diode 28 is continuously lighted by a fixed power.

The above mentioned optical head section 24 is mounted on a movable stand 99a, is moved in the radial direction of the photomagnetic disc 23 by using a position detecting means by a linear scale (not illustrated) by a VCM (abbreviation of a voice coil motor) 99b as a head feeding mechanism, moves near to a concentric or spiral object track, further applies a jump pulse to the tracking coil 90a to approach the object track so that recording and reproducing may be made to the track. This VCM 99b is controlled by the controller 98.

An electromagnet 31 forming a magnetic head recording a magnetic field modulation is arranged as opposed to the disc surface on the side opposite the above mentioned optical head section 24 and is moved in the radial direction of the photomagnetic disc 23 by the VCM 30 so that a magnetic field may be applied to the vertically magnetized film 27 part to which light beams are condensed and radiated. This VCM 30 is controlled also by the controller 98 and the electromagnet 31 is operatively connected with the optical head section 24 so as to move in the radial direction of the photomagnetic disc 23.

To the first winding 32 of this electromagnet 31 is fed such recording current as is shown in FIG. 10A corresponding to the recording signal by the resonant type magnetic field modulating circuit 33 of such circuit formation as is shown in FIG. 9 at the time of a recording mode. This winding 32 is fed with a current Io of a fixed frequency modulated in the amplitude by the recording signal.

This electromagnet 31 is provided with a second winding 34 in order to generate a fixed bias magnetic field. This second winding 34 is fed with such fixed direct current Idc as is shown in FIG. 10B through an inductor Lc from a direct current source Vc as shown in FIGS. 6 and 7. The direction of the bias magnetic field generated by the direct current Idc flowed through this winding 34 is set to be reverse to the direction of the magnetic field generated by the other winding 32. For example, as shown in FIG. 6, if the winding directions of the two windings 32 and 34 are the same, the directions of flowed currents Io and Idc will be reverse to each other. The number of windings and current value are so set that the size of the bias magnetic field by the winding 34 may be the average value of the maximum value and minimum value of the magnetic field by the winding 32.

Therefore, on the magnetic field generated from the electromagnet 31 are superimposed magnetic fields generated from the windings 32 and 34 and to the vertically magnetized film 27 is applied such magnetic field ±HM as is shown in FIG. 10C. In this FIG. 10C, the intensity ±Hcl necessary to orient in the magnetic field direction the magnetization of the vertically magnetized film is set to be |HM| > |Hcl | so that an over written record may be positively made.

The above mentioned inductor Lc has an inductance sufficiently larger than the inductance of the second winding 34 forming the head. This high frequency impedance is so large that the interference of the direct current circuit connected to this winding 34 and the high frequency circuit connected to the winding 32 through which a high frequency recording signal flows with each other is small.

On the other hand, in the reproducing mode, the switches Sa and Sb are both switched off, for example, by the controller 98 and the magnetic field generating apparatus 25 generates no magnetic field.

In this embodiment, in the reproducing mode, while a laser light of a fixed intensity which can elevate the temperature of the vertically magnetized film 27 of the photomagnetic disc 23 to be above the Curie point is being radiated, the photomagnetic disc 23 is rotated and moved with the rotary axis L as a center, a magnetic field |±HM| exceeding the intensity |±Hc| necessary to orient the vertically magnetized film 27 in the magnetic field direction is applied to the part of the above mentioned vertically magnetized film 27 having become above about the Curie point as in FIG. 10C and the magnetization is held when the temperature drops so that such magnetizing patterns of magnetizing directions reverse to each other as are typically shown by the marks $\oplus$ and $\ominus$ in FIG. 10D may be formed on the recording track of the vertically magnetized film 27 and thereby a magnetic field modulation record which can be over written may be possible.

Also, in this embodiment, the magnetic field modulating circuit 33 by such resonant circuit as is shown in FIG. 9A or 9B is used to obtain such resonant recording current as is shown in FIG. 10A. This magnetic field modulating circuit 33 corresponds to generating a magnetic field for recording by driving the magnetic head winding 36 except the bias magnetic field generating part from the magnetic head driving circuit also the same as in the other embodiments.

In FIG. 9A or 9B, the reference numeral 36 represents a magnetic head winding corresponding to the winding 32 in FIG. 6 or 7 and 37 represents a condenser connected in series with the magnetic head winding 36. Also, a circuit consisting of a diode D, resistance R and switch SW connected in parallel with a condenser 37 or magnetic head winding 36 of a resonant element is to control the function of the resonant element and the resistance R is to determine the control amount. That is to say, when the switch SW is off, the Q value of the series resonant circuit of the condenser 37 and magnetic head winding 36 will be large and, in this state, if a current is fed, the magnetic field generated by the magnetic head winding 36 will be large. On the other hand, if the switch SW is on, the resistance R inhibiting the resonance will be connected in parallel with the magnetic head winding 36 and therefore the Q value of the series resonant circuit will become very small. In this state, the Q value of the series resonant circuit will be made small by the resistance R and the generated magnetic field will become small.

Here, in the magnetic field modulating circuit 33 in FIG. 9A or 9B, a clock signal CK of a resonant frequency is input into such resonant circuit as is shown in FIG. 11A. That is to say, as the frequency f ck coincides with the frequency $fo = \frac{1}{2}\pi\sqrt{LC}$ of the resonant conditions of the capacity C of the condenser 37 and the inductance L of the magnetic head winding 36, a resonant current I o varying in one direction will flow through the magnetic field modulating circuit 33. At this time, if the switch SW is on at the time of "1" and off at the time of "0" as synchronized with the resonant frequency, in response to the record information and according to such modulating signal MO as is shown in FIG. 11B, as the resonance will be suppressed by the resistance R when the switch SW is on, the resonant current I o will be suppressed to be of a low current value I o min and, as the resonance will not be suppressed when the switch is off, the resonant current I o will be of a large current (peak) value I o max and a resonant waveform varying in the amplitude in response to the modulating signal MO as shown in FIG. 11C will be made. That is to say, when the suppression/nonsuppression of the series resonant circuit is switched in response to the pulse signal of the modulating signal MO, the currents of the large peak value I o max and small peak value I o min will flow through the magnetic head winding 36 of the series resonant circuit and recording magnetic fields corresponding to the respective peak values Io max and I o min will be able to be generated.

Therefore, when this circuit 33 is used, even if the inductance L of the head winding 36 is large, under the resonant condition, the rising and falling speeds of the current will become high, as a large current can be easily flowed with an exciting signal of a low amplitude, the turning time of the superimposed magnetic field HM shown in FIG. 10C will be small and, even if the distance Sp between the head and disc (See FIG. 6) is so large as to be, for example, above 100 μm, a magnetic field intensity of a value large enough to magnetize the vertically magnetized film will be obtained.

As in the above, when the photomagnetic recording and reproducing apparatus 21 of this embodiment is used, with a simple mechanism and circuit formation, a magnetic field modulating record capable of being over written will be able to be easily made and a high density recording will be able to be coped with. The magnetic field generated by the magnetic head is so large that, even if the distance between the magnetic head and disc is made large, the magnetic field required for recording will be able will be able to be applied to the photomagnetic disc 23 and the advantage of non-contact recording of photomagnetic recording will not be impaired.

Figure 12:
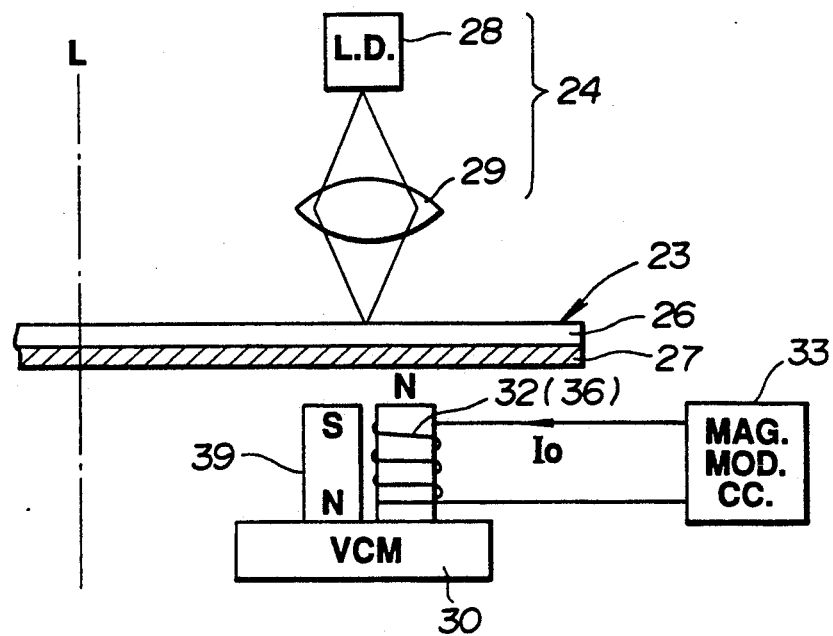
FIG. 12 is a formation view of a modification of a recording magnetic field generation apparatus.

In the above mentioned first embodiment, an electromagnet is used as a means of giving a fixed bias magnetic field but a fixed bias magnetic field generating means can be formed by using a permanent magnet 39 as in the modification shown in FIG. 12. The direction of the bias magnetic field by this permanent magnet 39 is so set as to be reverse to the direction of the magnetic field generated by the recording winding 32.

In this case, the winding of the magnetic head may be one and, if the magnetic field modulating circuit 33 is made the same as is shown in FIG. 9A or 9B, the same magnetic field modulating record as is described above will be possible. Further, the leaking magnetic field of the actuator used to control the position of the objective lens 29 of the optical head section 24 may be utilized instead of this permanent magnet. In such case, there is an advantage that the magnetic field modulating record can be made with a simple formation. By the way, in FIG. 12, the same as in FIG. 6, the optical head section 24 is shown as simplified.

According to the above mentioned first embodiment or modificatin, even if the distance between the magnetic head (electromagnet 31) and photomagnetic disc 23 is large, high density recording will be made and therefore, even if a floating head or film head of a complicated shape is not used for the magnetic head, the magnetic head may be of a simple structure and the distance between the head and disc need not be controlled. Without using an optical modulating means, with a simple formation, recording can be made with a magnetic field modulating system.

Figure 13:
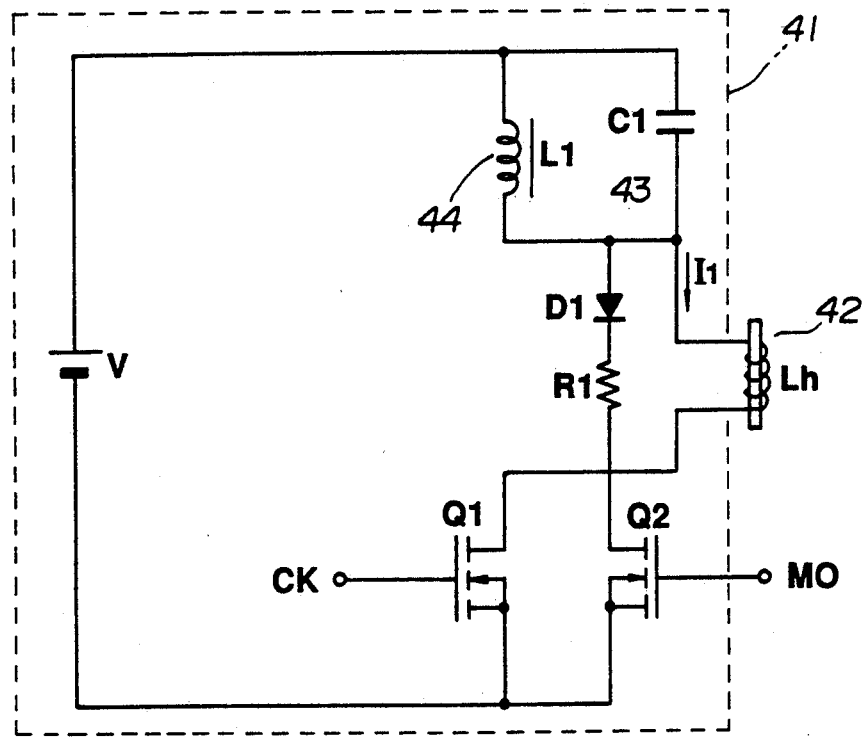
FIG. 13 is a circuit diagram of a magnetic field modulating circuit in the second embodiment of the present invention.

Now, a magnetic field modulating circuit 41 formed of a one side power source is shown in FIG. 13. In this embodiment, a winding 42 of a magnetic head of an inductance Lh is connected in series with a condenser 43 of an electrostatic capacity C and is connected, for example, to the cathode of a direct current power source V through a switching device (MOSFET) Q to form a series resonant circuit operated by the one side power source. Here, an inductor 44 connected in parallel with the condenser 43 and connected at one end to the anode of the direct current power source V has an inductance Ll sufficiently larger than the inductance Lh of the winding 42 forming the magnetic head (for example, Ll>10 Lh) and gives a direct current bias voltage to the switching device Q1, the electric charge accumulated by the condenser 43 when the switching device Q1 is on is discharged by the reverse electromotive voltage generated at both ends of the inductor 44 when the switching device Q1 is off and the condenser 43 is charged by the reverse polar voltage when on so that the resonant state may be kept even in the one side power source.

Therefore, when a clock signal CK of a frequency $fo = \frac{1}{2\pi\sqrt{LH\ Cl}}$ at which the resonant condition holds as shown in FIG. 14A is input into the gate of the switching device Q1, a current of the resonant frequency fo will flow through the head winding 42. This current is a resonant current and is therefore determined in the size by the power source voltage and other circuit impedances than Lh and Cl. Even if a direct current power source V of a low voltage is used, without resorting to the inductance Lh of the head winding 42, a large current will be able to be flowed.

On the other hand, when a switching device Q2 is connected to one end of the head winding 42 through a diode D1 and resistance R1 and a modulation controlling signal MO corresponding to such recorded data as are shown in FIG. 14B is input into the gate of the switching device Q2, the amplitude of the resonant current I1 flowing through the magnetic head winding 42 made resonant by the switching operation of the switching device Q1 when the switching device Q2 is on will be suppressed by the resistance R1 functioning as a damping element becoming parallel with this magnetic head winding 42 and will vary as shown in FIG. 14C.

Here, in FIG. 14C, I1 max is a resonant current peak value when not suppressed, I1 min is a peak value of the resonant current suppressed by the damping element by the switch of the switching device Q2. Here, D1 is to prevent the mutual interference of the switching operations of the switching devices Q1 and Q2 by making the current flowing through the switching device Q2 flow in one direction. The size of I1 min can be varied by adjusting the resistance R1. I1 max/I1 min can be made above 3 by making R1 small.

When the current I1 varying in the amplitude in response to the recorded data thus flows through the head winding 42, such magnetic field of one direction varying in the amplitude from H1 min to H1 max as is shown in FIG. 14D will be applied to the vertically magnetized film 27 of the disc 23 from the main magnetic pole of the head. When a bias magnetic field −H2 of a fixed size is applied by another magnet (for example, the permanent magnet 39 shown in FIG. 12) in the direction reverse to this magnetic field, the superimposed magnetic field superimposed on the vertically magnetized film 27 will vary as shown in FIG. 14E. Here, when the allowable minimum values in the respective directions of the varying superimposed magnetic field are represented respectively by +HM and −HM, if the head generated magnetic field H1 and bias magnetic field H2 are so set as to be $|HM| > |Hcl|$ or the intensity ±Hcl required to orient in the magnetic field direction the magnetization of the vertically magnetized film 27, the vertically magnetized film 27 will be magnetized as shown in FIG. 14F in response to the recording siganl.

In this magnetization pattern diagram, the hatched part of the mark ⊕ and the blank part of the mark ⊖ typically represent respective magnetized regions in the directions reverse to each other.

According to this system, with a simple circuit formation, new information can be over written and recorded on already recorded magnetized information.

FIG. 15 shows a formation of a magnetic field modulating circuit 41' different from FIG. 13.

In FIG. 15, a diode D2 and resistance R2 are circuits newly added to the embodiment of FIG. 13. The head winding 42 is connected at both ends to the switch device Q2 through the diode D1 and D2 and resistances R1 and R2. Here, D1 and D2 are to prevent the mutual interference of the operations of the switching devices Q1 and Q2. The size of the current value I1 min in the magnetic head winding 42 shown in FIG. 14C is set by adjusting the resistances R1 and R2.

This embodiment is a circuit wherein, the same as in the embodiment in FIG. 13, such resonant clock CK as is shown in FIG. 14A is applied to the gate of the switching device Q1, the condenser 43 and magnetic head winding 42 are made resonant and such modulation controlling signal MO corresponding to recorded data as is shown in FIG. 14B is input into the gate of the switching device Q2 to control the amplitude of the resonant current I1 flowing through the magnetic head winding. However, when the switching device Q2 is on, the head winding 42 will be simultaneously connected at both ends 2a and 2b with the cathode of the power source V so that the effect of suppressing the amplitude of the resonant current may be higher than in the case of the embodiment in FIG. 13.

That is to say, as the ratio of I1 max/I1 min of the resonant currents I1 max and I1 min shown in FIG. 14C can be made larger than in the embodiment in FIG. 13, the difference H1 max−H1 min of the head generated magnetic field shown in FIG. 14D can be made larger, therefore respective absolute values in one direction and another direction in such superimposed magnetic field superimposed with a bias magnetic field as is shown in FIG. 14E become larger and, with a smaller power source voltage, the magnetic field modulation can be easily recorded.

When the circuit of the present invention is used, the current peak form at the resonant frequency will become wider than in the general LC resonant circuit, therefore a stabilized current will be able to be fed, the one side power source will be operated, the circuit will be simple and therefore a magnetic field modulating circuit will be able to be easily formed.

By the way, the present invention can be realized by using a variable capacity condenser (variable capacity diode) for the condenser or using a saturable transformer for the magnetic field generating coil to vary from outside the capacities and inductances of the respective devices.

As descrobed abpve. according to the first to third embodiments, a series resonant circuit is formed by connecting in series a magnetic field generating coil and a condenser, is excited by a signal synchronized with the resonant frequency of this series resonant circuit and is suppressed in the resonance with a signal corresponding to record data, a magnetic field corresponding to the recorded data is applied to a photomagnetic recording medium and therefore, even if the inductance forming the magnetic head is large, a magnetic field which can record at a high speed in response to the recorded data will be able to be generated and a high density record which can be over written will be able to be made.

Figure 16:
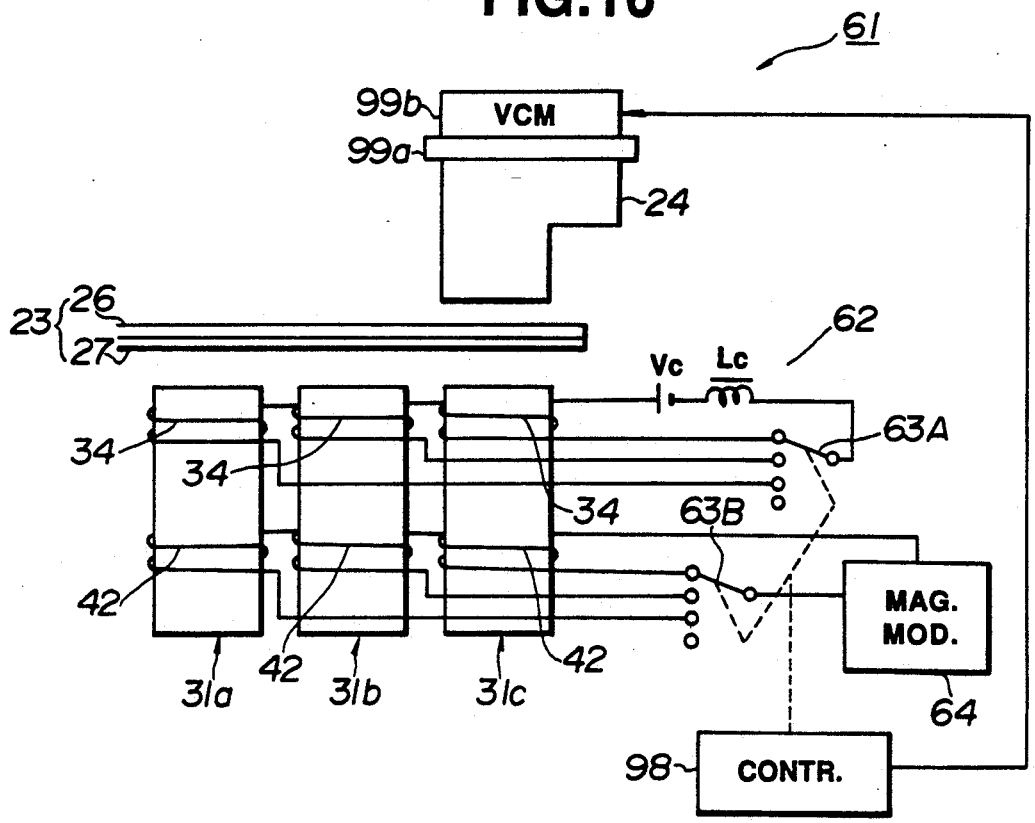

FIG. 16 shows a photomagnetic recording and reproducing apparatus 61 of the fourth embodiment of the present invention.

In this embodiment, there is used a magnetic field generating apparatus (magnetic head driving circuit) 62 different from the magnetic field generating apparatus 25 in the first embodiment shown in FIG. 7.

In this magnetic field generating apparatus 62, a plurality of the electromagnets 31 shown in FIG. 7 are arranged in the radial direction of the photomagnetic disc 23 (in FIG. 16, the plurality of electromagnets are represented by reference numerals 31a, 31b and 31c), the VCM 30 shown in FIG. 7 is not provided and the electromagnets 31i (i=a, b and c) to be used to pass electricity are to be switched. These switching switches 63A and 63B are controlled in switching as operatively connected and the electromagnet 31i opposed to the optical head section 24 is to be selected. The disc radial direction position of the optical head section is recognized by reading out the address signal provided in each track in the disc. The controller 98 is made to select one of electromagnets having the relation corresponding to the value of the address signal determined in advance in response to the address signal read out of the optical head section 24.

Thus, by selecting the electromagnet 31i to be used, without requiring the VCM 30, the magnetic field required to record in the position irradiated with the light beam can be applied.

Figure 17:
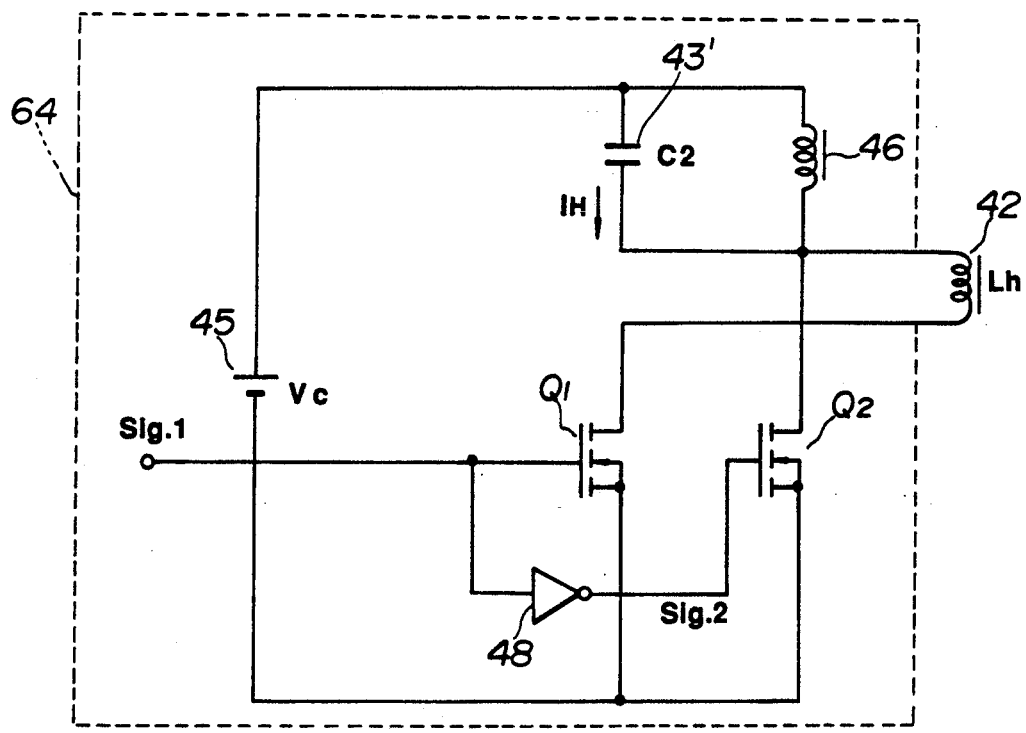

Also, in this embodiment, the magnetic field modulating circuit 64 shown in FIG. 17 is used.

In the winding 34 of each electromagnet 31i, a bias magnetic field Hb is formed by the winding 34 through which a fixed direct current I dc flows through the inductor Lc from the direct current power source Vc and, by such magnetic field modulating circuit 64 as is shown in FIG. 17, as shown in FIG. 18a, a winding through which an arc-like recording current IH modulated by a recording signal Sig. 1 flows is wound and a head coil 42 is provided. In FIG. 17, one head coil 42 is shown as selected.

Therefore, the magnetic field generated by the winding 34 and head coil 42 is superimposed on the magnetic field generated by the electromagnet 31i and such magnetic field He as is shown in FIG. 18f is applied to the vertically magnified film 27.

Here, the inductance Lc has an inductance sufficiently larger than the inductance of the winding 34. Its high frequency impedance is so large that the interference between the direct current circuit connected to the winding 34 and the high frequency magnetic field modulating circuit 64 connected to the head coil 42 is small.

As described in the first embodiment, also in this embodiment, while a laser light of a fixed intensity which can make the temperature of the vertically magnetized film 27 of the photomagnetic disc 23 above the Curie point is being radiated, the photomagnetic disc 23 is rotated and moved with the rotary axis L as a center, the magnetic field $|\pm He|$ exceeding the intensity $|\pm Hc|$ required to orient in the magnetic field direction the above mentioned vertically magnetized film 27 is applied to the part of the vertically magnetized film 27 having become above about the Curie point and, when the temperature falls, the magnetization is retained so that such magnetized patterns of magnetizing directions reverse to each other as are typically shown by the marks $\oplus$ and $\ominus$ in FIG. 18g may be formed on the recording track of the vertically magnetized film 31b and thereby an over writable magnetic field modulating record may be possible.

In this embodiment, such magnetic field modulating circuit 64 as is shown in FIG. 17 is formed to obtain such recording current as is shown in FIG. 18c.

In FIG. 17, the head coil 42 is a coil of the magnetic field modulating magnetic head and its inductance is Lh. A condenser 43' is connected in series with this head coil 42 and its capacity is C2. This condenser 43' and head coil 42 form a series resonant circuit which is connected with a direct current power source 45 through a switching device Q1.

An inductor 46 for storing energy is connected in parallel with the condenser 43' of the above mentioned series resonant circuit at both ends, has an inductance Le sufficiently larger than the inductance Lh of the head coil 42 and is connected to the power source 45 through a second switching device Q2. Here, the switching devices Q1 and Q2 are such high speed switching semiconductor devices as MOS-FET as shown, for example, in this FIG. 17. Here, a recording signal represented by Sig. 1 is applied to the first switching device Q1 at the gate so that the switching device may be on when the recording signal is "1" and may be off when it is "0".

On the other hand, a signal Sig. 2 obtained by turning the recording signal Sig. 1 through an inverter 48 is applied to the second switching device Q2 at the gate so that the switching device may be on when the recording signal is "0" and may be off when it is "1" and thus the two switching devices Q1 and Q2 may be alternately on and off.

In this embodiment, the second switching device Q2 is switched on to flow a current through the inductance 46 to accumulate energy, then this second switching device Q2 is switched off and, for only the resonant period of the series resonant circuit by the condenser 43' and head coil 42, the first switching device Q1 is switched on to quickly flow the above mentioned accumulated energy through the head coil 42 in the series resonant state (low impedance).

The operation of the thus formed magnetic field modulating circuit 64 shall be explained with reference to FIGS. 17 and 18.

First, in FIG. 18a, in case the recording signal Sig. 1 is "0", the output Sig. 2 of the inverter 48 in FIG. 17 will be "1", therefore the first switching device Q1 will be off and the second switching device Q2 will be on.

Here, while the second switching device Q2 is on, the inductor 46 will be conductive with the power source 45, a current will flow and therefore exciting energy will be accumulated.

Here, if the inductance of the inductor 46 is represented by Le and the exciting current is represented by Ie, the accumulated energy EL will be represented by $EL = \frac{1}{2} Le\, Ie^2$. When the recording signal Sig. 1 becomes "1" and the signal Sig. 2 becomes "0", the first switching device Q1 will be on, the second switching device Q2 will be off and therefore a reverse electromotive voltage Vr will be generated in the inductor 46 at both ends in response to the size of the accumulated energy EL. At the same time, this voltage Vr will be applied to the condenser 43 connected in parallel with the inductor 46 and the condenser 43' will be charged in the direction reverse to the direction when the recording signal Sig. 1 is "0".

On the other hand, as the first switching device Q1 is on, the condenser 43' will be conductive with the power source 45 through the head coil 42.

Here, when the inductance Lh of the head coil 42 and the capacitance C2 of the condenser 43' are so set as to be in the relation of $ton\, 1 = 2\pi\sqrt{LC}$ for the ON-time ton 1 of the first switching device Q1, such one direction current $I_H$ as is shown in FIG. 18c will flow through the head coil to describe a resonant arc in the series resonant state. Thus, the energy of the inductor 42 will be returned to the power source 45 through the head coil 42 under the resonant condition through the resonant condenser 43'. Therefore, as shown in FIG. 18c, the current $I_H$ corresponding to the recording signal Sig.1 will flow through the head coil 42 and the magnetic field Hh on the recording film generated from the head will be as in FIG. 18d.

At this time, when a fixed bias magnetic field Hb directed reversely to the magnetic field generated from the head and of a size about ½ as large is applied onto the recording film as in FIG. 18e by the winding 34, the magnetic field He in which the magnetic fields Hh and Hb are superimposed on each other will be as in FIG. 18f.

Here, if the positive and negative maximum value ±He max of the magnetic field He is set to be above the magnetic field ±Hc required to magnetize the recording film, the magnetic field modulation corresponding to the recording signal Sig. 1 will be able to be recorded in the recording film and such magnetized pattern as is shown in FIG. 18g will be formed.

By the way, in FIG. 18g, the marks ⊕ and ⊖ represent that the magnetizing directions are reverse to each other.

Therefore, if the magnetic head driving circuit 62 of this embodiment is used, the sum of the voltage Vc of the power source 45 and the reverse electromotive voltage Vr generated in the inductor 46 will be applied when the switch device Q1 is on and, at the same time, the exciting current will flow under the series resonant condition. Therefore, if the reverse electromotive voltage Vr is large, even if the power source voltage Vc is low, the rising time of the current flowing through the head will be able to be made short and, if the series resonant condition holds, the current flowing through the head will be determined by only the loss resistance of the series resonant circuit without resorting to the inductance of the head, therefore a large current will be able to be flowed and a high density magnetic field modulation will be able to be recorded with a low power consumption.

Here, in order to enlarge the reverse electromotive voltage Vr, the inductance Le of the inductor 46 is made sufficiently larger than the inductance Lh of the head coil 42 and, in order to enlarge the exciting current Ie of the inductor 46, the ON-time of the second switching device Q2 is made large. Therefore, the value of the capacitance C2 at $ton\, 1 = 2\pi\sqrt{LhC2}$ of the resonant condition will be, in fact, a sum of the capacitance C2 of the resonant condenser 43' and the parasitic capacitance included in the inductor 46 and therefore will be larger than the capacitance C2 of the resonant condenser 43'.

This embodiment is different from the first to third embodiments and is not a system for controlling the amplitude of the resonant waveform but is a system wherein the energy stored in the auxiliary inductor 46 is moved to the resonant condenser 43' and a current is flowed through the head coil 42 under the LC series resonant condition of the inductance Lh of the head coil 42 and the capacitance C2 of the resonant condenser 43'.

Therefore, it is not necessary to maintain the resonance at a fixed frequency as in the first to third embodiments and, if the LC constant is determined in response to the pulse width of "1" of the recording signal, irrespective of the distance of pulses, during "1", a current will flow through the coil 42 while describing a resonant arc. Therefore, the time required to turn the current is not necessary as in the first to third embodiments. As shown in FIG. 18a, the time TA when the recording signal Sig. 1 is "1" can be made substantially equal to the time TB when the recording current IH is flowed (that is, TA≃TB). Therefore, even in the high density recording, the C/N at the time of reproduction can be made larger. For comparison, the recording current IH' for the recording signal Sig. 1 in case the magnetic field modulating circuit in FIG. 15 is used is shown in FIG. 18h.

Also, in this embodiment, as the resonant condenser 43' absorbs the accumulated energy of the inductor 46, the sharp fluctuation of the current to the head coil 42 with the surge pulse-like high voltage generated in the inductor 46 at the moment when the switching device Q2 is off will be inhibited and a stable current will be fed to the head coil 42 while describing a resonant arc.

Therefore, the voltage generated in the switching device Q2 at both ends when the switching device Q2 is off will be also inhibited, the switching loss will be reduced and the high frequency noise generated from the driving circuit 62 will be able to be reduced.

It is obvious that, as the magnetic field generating means in the fourth embodiment, a single electromagnet (for example, 31a) may be moved in the radial direction of the photomagnetic disc 23 by a VCM or the like.

FIG. 19 shows a magnetic field modulating circuit 51 in the fifth embodiment of the present invention.

This fifth embodiment is fundamentally of substantially the same formation as of the fourth embodiment but, instead of the signal Sig. 2 made by turning the recording signal Sig. 1 by the inverter 48, such signal Sig. 2' as becomes "1" only for a fixed period T before the recording signal Sig. 1' is passed through a signal generating circuit 52 and the recording signal Sig. 1 becomes "1" as shown in FIGS. 21b and 21c is applied to the second switching device Q2. That is to say, the switching operation for the second switching device Q2 is different from that in the fourth embodiment.

FIG. 20 shows a signal generating circuit 52 for generating the recording signals Sig. 1 and Sig. 2.

The recording signal Sig. 1' shown in FIG. 21a is delayed by the time T by a delaying circuit 53 and the recording signal Sig. 1 shown in FIG. 21b is generated and is input into the switching device Q1. Also, the recording signal Sig. 1' is input into a monostable multivibrator (abbreviated as MSM hereinafter) 54 and a signal Sig. 2' (shown in FIG. 21c) becoming "1" for the time width T by the rise of the recording signal Sig. 1' is generated and is input into the switching device Q2.

The other formations are the same as in the fourth embodiment and are represented by the same reference numerals.

The operation of this fifth embodiment shall be explained in the following with reference to FIG. 22.

As shown in FIG. 22a, the recording signal Sig. 1 is applied to the first switching device Q1 and, as shown in FIG. 22b, such signal Sig. 2' as becomes "1" only for a fixed period T before the recording signal Sig. 1' becomes "1" is applied to the second switching device Q2. Thus, in the inductor 46, the switching device Q2 becomes on in response to the signal Sig. 2' for the fixed period T just before the switching device Q1 becomes on in response to the recording signal Sig. 1.

Here, if the inductance Le is fixed, the energy $EL = \frac{1}{2} Le\ Ie^2$ accumulated in the inductor 46 will be determined by the size of the exciting current Ie flowing through the inductor 46. If the voltage of the power source 45 is represented by Vc and the ON-time of the switching device Q2 is represented by $t_{ON}$, the current Ie will be represented by $Ie = Vc\ t_{ON}/Le$. Therefore, if $t_{ON} = T$ is constant, the energy accumulated in the inductor 46 will be constant irrespective of the number of "0" for "1" of the recording signal Sig. 1 and therefore the wave height value I max of the current $I_H$ flowing through the head coil 42 will be constant as compared with the case of the fourth embodiment in which the ON-time $t_{ON}$ is different depending on the recorded data. When the ON-time of the switching device Q2 is restricted, even if "0" continues in the recording signal Sig. 1, the loss of the switching device Q2 will not increase and the power consumption of the head driving circuit will be able to be reduced. Therefore, this embodiment can be adapted to the system wherein the number of "0" for "1" greatly varies as in the "2 - 7 modulating system" of the record modulating system often used for photomagnetic recording.

As described above, according to the fourth or fifth embodiment, the head coil is provided in series with the condenser, a high reverse electromotive force can be fed to the head coil side by the inductor connected in parallel with this condenser and made larger in the inductance than the above mentioned head coil, therefore the system can be driven by a low voltage power source, a large current not dependng on the inductance of the head coil and quick in rising can be flowed and a high density magnetic field modulation recording can be realized with a low power consumption.

Figure 24:
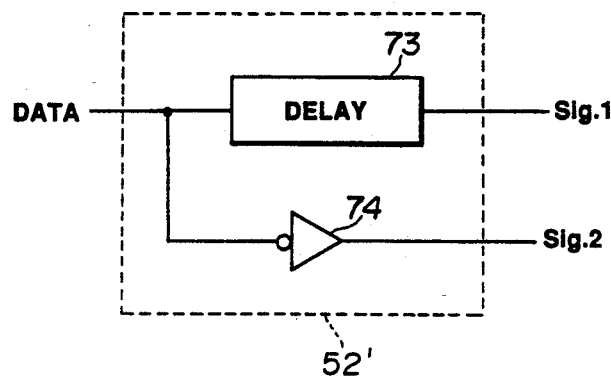

FIG. 23 shows a magnetic field modulating circuit 71 of the sixth embodiment of the present invention. In this embodiment, the connecting point of the condenser 43' and head coil 42 and the connecting point of the inductor 46 and second switching device Q2 are connected with each other through a connecting condenser 72 in the magnetic field modulating circuit 51 shown in FIG. 51. Also, a signal generating circuit 52' of this embodiment is different from the signal generating circuit 52 shown in FIG. 20 and is formed of a delaying circuit 73 and inverter 74 as shown in FIG. 24.

The capacity C0 of the above mentioned connecting condenser 72 is so set as to be of a value sufficiently larger than the capacity C2 of the condenser 43' forming a series resonant circuit.

When the above mentioned connecting condenser 72 is provided, it will be improved that, in case the above mentioned two connecting points are directly connected with each other, in case the period when the first switching device Q1 is off is long, the electric current will flow to charge the electrostatic capacity (the capacity between the drain and source in the case of the MOSFET) of this first switching device Q1.

That is to say, even in case the period when the first switching device Q1 is long, the head coil 42 and first switching device Q1 will be interrrupted from the direct current power source 45 by the connecting condenser 72 and therefore the current leakage by charging the electrostatic capacity of the first switching device Q1 will be dissolved.

The others are of the same formations as in the embodiment in FIG. 19.

The operation of the thus formed magnetic head driving circuit shall be explained in the following.

First of all, as shown in FIG. 25a, in case the recorded data are "0", the signal Sig. 2 will be "1", the signal Sig. 1 will be "0", therefore the first switching device Q1 will be off and the second switching device Q2 will be on. Here, while the second switching device Q2 is on, the inductor 46 will be conductive with the power source 45, a current will flow and therefore the exciting energy will be accumulated.

Then, in case the record data are "1", the signal Sig. 2 will be "0", therefore the second switching device Q2 will be off and a reverse electromotive voltage Vr will be generated at both ends of the inductor 46 in response to the size of the accumulated energy. At the same time, this voltage Vr will be applied to a condenser 43' in a series resonant circuit and this condenser 43' will be charged with recorded data in the direction reverse to that at the time of "0". On the other hand, in the first switching device Q1, as shown in FIG. 25b, the signal Sig. 2 will become "0", the gate signal Sig. 1 will become "1" a little later and after Td and therefore the second switching device Q2 will become off and then on after Td. This delay time Td is smaller than the time when the record data are "1", is determined by the clock frequency of the recorded data and the capacities C2 and C0 of the condensers 43' and 72 and is so set that the head exciting ccurrent $I_H$ may be maximum.

Here, when the inductance Lh of the head coil 42 and the capacity C2 of the condenser 43' are set to be in the relation of $t_{ON}1 = 2\pi\sqrt{LhC2}$ with the ON-time $t_{ON}1$ of the first switching device Q1, such one direction current $I_H$ as is shown in FIG. 25d will flow through the head coil 42 under the series resonant condition so as to describe an arc.

Thus, the energy of the inductor 46 will be returned to the power source 45 through the head coil 42 under the resonant condition through the resonant condenser 43'. Therefore, at the time of "1", the resonant current $I_H$ will flow through the head coil 42 in response to the signal Sig. 1 and, at the time of "0", the exciting current will be cut off the power source 45 by the condensers 43' and 72 and will not flow but the exciting current shown in FIG. 25d will flow. Here, the connecting condenser 72 connects as alternating currents the series resonant circuit comprising the first switching device Q1, head coil 42 and condenser 43' and the reverse electromotive voltage generating circuit comprising the second switching device Q2 and inductor 46 with each other and interrupts them as direct currents from each other. When the capacity C0 of the connecting condenser 72 is made sufficiently larger than of the resonant condenser 43', its effect will become remarkable. Therefore, it is desirable to so set the capacity C0 of the connecting condenser 72.

Figure 25F:

When the exciting current $I_H$ varying in one direction flows through the head coil 42 in response to the recorded data as mentioned above, the magnetic field Hh on the vertically magnetized film 27 as a recording film generated from the head will be as in FIG. 25e. At this time, when a fixed bias magnetic field Hb directed reversely to the magnetic field generated from the head and of a size about ½ as large is applied onto the recording film, the magnetic field He made by superimposing the magnetic fields Hh and Hb will be as in FIG. 25f.

Here, when the positive and negative maximum value ±He max of the magnetic field He is set to be above the magnetic fields +Hc and −Hc required to record or erase the recording film, a magnetic field modulation record corresponding to the recorded data will be able to be made on the recording film.

Therefore, when the magnetic head driving circuit of this embodiment is used, when "0" continues in the recorded data, even if the period when the first switching device Q1 is off becomes long, as the head coil 42 and first switching device Q1 are cut off the direct current power source 45 by the connecting condenser 72, the leakage by charging the electrostatic capacity between switches of this switching device Q1 will be able to be dissolved. That is to say, when the record data are "0", the exciting current $I_H$ flowing through the head coil 42 will be 0, therefore only the bias magnetic field Hb of a fixed intensity in the erasing direction from outside will be applied onto the recording film and the noise at the time of reproduction will be reduced. Also, the power consumption in the driving circuit when the first switching device Q1 is off can be reduced. Further, as the timing when the first switching device Q is on is made later than the timing when the second switching device Q2 is off, the energy accumulated in the inductor 46 can be flowed to the head coil 42 after being sufficiently moved to the resonant circuit and therefore, even in the circuit provided with the connecting condenser 72, such optimum switch timing as can maximize the exciting current flowing through the head coil 42 can be made by adjusting the delay time Td.

Figure 26:
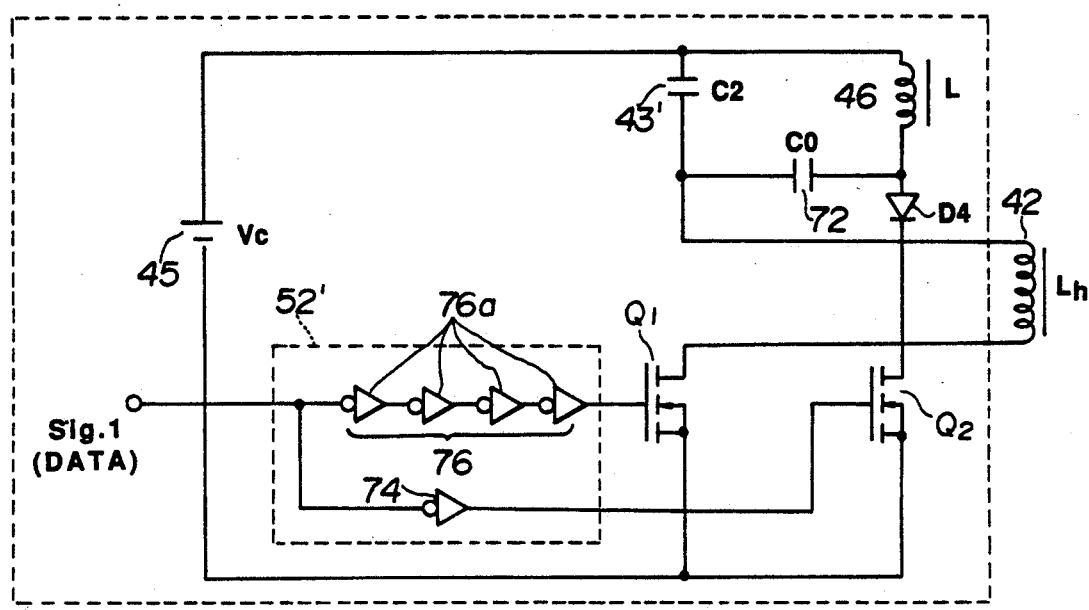
FIG. 26 is a circuit diagram of a magnetic field modulating circuit in the seventh embodiment of the present invention.

FIG. 26 shows a magnetic field modulating circuit 75 in the seventh embodiment of the present invention.

In this embodiment, a normal direction diode D4 is inserted between the inductor 46 and second switching devce Q2 and a signal generating circuit 52' is formed of the inverter train 76 and inverter 74 in the sixth embodiment shown in FIG. 23. The others are of the same formations as in the sixth embodiment.

The above mentioned diode D4 is to prevent the reverse electromotive voltage generated at both ends of the head coil 42 when the first switching device Q1 is off from vanishing through the electrostatic capacity between the switches of the first and second switching devices Q1 and Q2 and is to set the terminal on the switching device side of the inductor 46 in the negative potential through the condenser 72 so that a larger current may be flowed by the inductor 46 when the second switching device Q2 is on. Therefore, the reverse electromotive voltage when the first switching device Q1 is off will be that much larger and a larger exciting current will be able to be flowed through the head coil 42 by a low voltage power source.

If the inverter 76a forming the inverter train 76 has a propagating time of ti per device, when N inverters 76a are connected in series, the timing of the switch of the first switching device Q1 will be able to be delayed to be later by Td=(N−1) ti than the timing of the switch of the second switching device Q2 and the optimum switch timing will be able to be set without using any special delaying device. By the way, here the inverter 74 is assumed to also have a propagating time equal to that of the inverter 76a.

According to this embodiment, a head driving circuit through which a large exciting current can be made to flow at a low voltage of several volts can be realized with a simple formation and few component parts.

Figure 27:
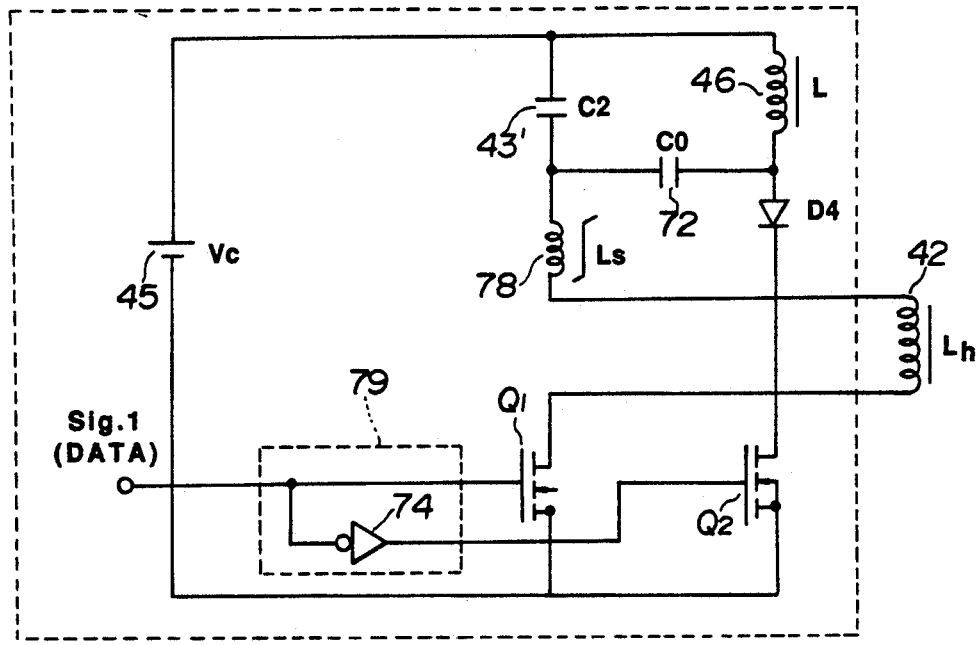
FIG. 27 is a circuit diagram of a magnetic field modulating circuit in the eighth embodiment of the present invention.

FIG. 27 shows a magnetic field modulating circuit 77 in the eighth embodiment of the present invention.

This embodiment is fundamentally the same as the seventh embodiment shown in FIG. 26 but uses a saturable coil 78 for the means of delaying the first switching device Q1. Also, in this embodiment, the signal generating circuit 79 is formed of an inverter 74.

When the above mentioned saturable coil 78 is inserted between the head coil 42 and resonant condenser 43', even if the first switching device Q1 is on, until a current flows through the saturable coil 78 to cause a magnetic saturation, the coil 78 will have such large inductance that the exciting current will be momentarily prevented and an equevalent state that the switch timing is delayed will be able to be realized. The delaying time can be adjusted by varying the number of windings of the saturable coil 78 and the magnetic characteristic of the core used for the magnetic head. According to this embodiment, the switching delaying circuit can be formed of one driven part of the saturable coil 78 and therefore the magnetic head driving circuit can be simply realized.

FIG. 28 shows a magnetic field modulating circuit 101 in the ninth embodiment of the present invention.

In the above described respective embodiments, in one magnetizing direction, the data corresponding to "0" or "1" can be continuously recorded but, in the other magnetizing direcction, the same data are not adapted to be continuously recorded. In this embodiment, in either magnetizing direction, the same data can be continuously recorded.

In this embodiment, the condenser 43' is formed of a plurality of condensers Ca, Cb, Cc, . . . which are connected in parallel respectively through series switches Sa, Sb, Sc, . . . in the fourth embodiment shown, for example, in FIG. 17.

In the capacities of the above mentioned condensers Ca, Cb, Cc, . . . for example, the condenser Ca is equal to C2, Cb=3C2 and Cc=5C2, . . . .

The recorded data are input into a shift register 102 formed of flip-flops, for example, of seven steps and a clock generating circuit 103 formed, for example, of a FLL circuit so that a clock (See, for example, FIG. 29a) synchronized with the input recorded data (See, for example, FIG. 29b) may be produced and may be used as a signal for shifting the shift register 102. The delayed recorded data synchronized with this clock and output from the shift register 102 are applied to the gate of the first switching device Q1 as a signal Sig. 1. Further a signal Sig. 2 is generated through the inverter 48 and is applied to the gate of the second switching device Q2.

The parallel output end of the above mentioned shift register 102 is input into a decoder 104 and a control signal switching on/off the switches Sa, Sb, Sc, . . . is output from the decoder 104 in response to the data output from the parallel output end. As shown, for example, in FIG. 29a, seven data of "1 1 1 0 1 1 0" are input serially into the shift register 102 and, at the timing at which "1 1 1" are sequentially output from the serial output ends, the condensers Ca, Cb, Cc, . . . are held on as they are (See, for example, FIGS. 29c, 29d and 29e).

In this case, a resonant circuit of a capacity nine times as large as of the resonant circuit using only the condenser 43 for the electrostatic capacity will be made and therefore a large exciting current will flow under the resonant condition through the inductor 46 for a period three times as long as of the resonant circuit by the condenser 43'. The energy stored in the inductor 46 may be fed to the head coil 42 through the condenser 43'.

By the way, in the first embodiment, the optical head section 24 and magnetic head driving circuit are moved by moving means by respectively separate VCM's but may be moved by a common moving means.

In this ninth embodiment, the data of "0" or "1" can be continuously recorded in any direction by selectively switching and controlling the condensers Ca, Cb, Cc, . . . in response to the recording signal.

By the way, the above described respective embodiments can be partly combined to form different embodiments which also belong to the present invention.

What is claimed is:

1. A photomagnetic recording apparatus, comprising:
an optical head including a light beam generating means for generating a fixed intensity light beam and an optical system for condensing and irradiating said light beam onto a photomagnetic recording medium, said optical head arranged on a first side of said medium;
a recording magnetic biasing field generating means, arranged on the second side opposite to the first side of said medium, having:
a first magnetic field generating means having a series resonant circuit comprising a head coil and a capacitor connected in series to each other, a driving signal feeding means producing an exciting signal synchronized with the resonant frequency of said series resonant circuit for feeding said series resonant circuit with said exciting signal to cause said series resonant circuit to generate a first magnetic field to said medium, and a suppressing controlling means connected to said series resonant circuit for selectively suppressing a resonant characteristic of said series resonant circuit in response to a recording signal corresponding to recorded information by suppressing of current flowing through said coil; and
a second magnetic field generating means for generating a second D.C. magnetic field directed reversely to the direction of the first generated magnetic field.

2. An apparatus according to claim 1, wherein said apparatus further includes an optical head moving means for moving said optical head in a radial direction of said recording medium.

3. An apparatus according to claim 1, wherein said apparatus further includes a head coil moving means for moving said head coil in a radial direction of said recording medium.

4. An apparatus according to claim 1, wherein said second magnetic field generating means includes a permanent magnet arranged adjacent to said recording medium.

5. An apparatus according to claim 1, wherein said second magnetic field generating means includes an electromagnet arranged adjacent to said recording medium.

6. An apparatus according to claim 1, wherein the fixed intensity light beam with which said recording medium is to be irradiated is sufficiently intense to elevate a temperature of a vertically magnetized film formed on said recording medium to be substantially above the Curie temperature of said vertically magnetized film.

7. An apparatus according to claim 1, wherein said optical head also includes a reproducing optical system for reproducing information to be recorded.

8. An apparatus according to claim 1, wherein said suppressing controlling means comprises a switch connected in parallel with said head coil and is switched on and off by said recording signal and a resistance.

9. An apparatus according to claim 1, wherein said suppressing controlling means comprises a switch connected in parallel with said capacitor and is switched on and off by said recording signal and a resistance.

10. A photomagnetic recording apparatus, comprising:
an optical head including a light beam generating means for generating a fixed intensity light beam and an optical system for condensing and irradiating said light beam onto a photomagnetic recording medium, said optical head arranged on a first side of said medium;
a recording magnetic biasing field generating means, arranged on the second side opposite to the first side of said medium, having:
a first magnetic field generating means having a series resonant circuit comprising a head coil and a first capacitor connected in series with each other, a direct current power source for providing power to said series resonant circuit through a first switching means, an inductor connected in parallel with said first capacitor, said inductor having an inductance significant larger than an inductance of said head coil, second switching means provided in parallel with said head coil and said first switching means, and a control signal outputting means for controlling switching operations of said first and second switching means with a control signal which has a frequency which corresponds to a resonant frequency of the series resonant circuit; and
a second magnetic field generating means for generating a second magnetic field directed reversely to a direction of a magnetic field generated by said first magnetic field generating means.

11. An apparatus according to claim 10, wherein said first switching means comprises a first switching device to be switched.

12. An apparatus according to claim 10, wherein said second switching means comprises a second switching device to be switched.

13. An apparatus according to claim 10, wherein said first switching means comprises a first switching device and a first damping device connected in series with said first switching device and suppressing the resonance of said series resonant circuit.

14. An apparatus according to claim 10, wherein said second switching means comprises a second switching device to be switched and a second damping device connected in series with said second switching device and suppressing the resonance of said series resonant circuit.

15. An apparatus according to claim 13 or 14, wherein said control signal outputting means includes a first control signal outputting means for outputting a first control signal switching on and off said first switching means at a frequency twice as large as of said series resonant circuit every half period of said twice frequency and a second control signal outputting means for outputting a second control signal switching off said second switching means which is on in said first control signal in response to recorded information.

16. An apparatus according to claim 10, wherein a second capacitor having a larger capacitance than the capacitance of said first capacitor is further interposed between a connecting point of said first capacitor and said head coil and a connecting point of said inductor and said second switching means.

17. An apparatus according to claim 16 wherein said control signal outputting means outputs a first control signal which switches on said first switching means in response to recorded information for a period about ½ a resonant period of said series resonant circuit and switches it off for other periods.

18. An apparatus according to claim 17, further comprising a delaying means for delaying output of said first control signal by said control signal outputting means.

19. An apparatus according to claim 18 wherein said control signal outputting means outputs a second control signal controlling switching on and off said second switching means through a turning means for turning said first control signal.

20. An apparatus according to claim 18 wherein said control signal outputting means outputs a second control signal switching off said second switching means for the delaying time by said delaying means before the timing of switching on said delaying means through the turning means for turning said first control signal.

21. An apparatus according to claim 18 wherein said delaying means comprises a plurality of inverter circuits.

22. An apparatus according to claim 16, wherein a diode in a normal direction is interposed between said inductor and said second switching means for limiting current flow between said inductor and said second switching means to a single direction.

23. An apparatus according to claim 16, wherein a saturable coil is interposed in series with said head coil for delaying output of said first control signal.

24. An apparatus according to claim 10, wherein said control signal outputting means outputs a first control signal which switches on said first switching means in response to recorded information for a period about ½ a resonant period of said series resonant circuit and switches it off for other periods.

25. An apparatus according to claim 24, wherein said control signal outputting means controls said second switching means to be on and off with the second control signal made by turning said first control signal.

26. An apparatus according to claim 10, wherein said control signal outputting means has a second control signal outputting means for outputting a second control signal which switches on said second switching means for a fixed period by said control signal and a first control signal outputting means which outputs a first control signal switching on said first switching means for a period when said second switching means is off.

27. An apparatus according to claim 10, wherein said first capacitor comprises a plurality of condensers, and further comprising a switching means for switching the selection of said plurality of condensers, and a switching controlling means for selectively connecting said plurality of condensers in series with said head coil in response to recorded information.

28. An apparatus according to claim 10, wherein said apparatus further includes an optical head moving means for moving said optical head in a radial direction of the recording medium.

29. An apparatus according to claim 10, wherein said apparatus further includes a head coil moving means for moving said head coil in a radial direction of the recording medium.

30. An apparatus according to claim 10, wherein said second magnetic field generating means includes an permanent magnet arranged adjacent to said recording medium.

31. An apparatus according to claim 10, wherein said second magnetic field generating means includes an electromagnet arranged adjacent to said recording medium.

32. An apparatus according to claim 10, wherein the fixed intensity light beam with which said recording medium is irradiated elevates a temperature of a vertically magnetized film formed on said recording medium to be substantially above the Curie temperature of said film.

33. An apparatus according to claim 10, wherein said optical head also includes a reproducing optical system for reproducing information to be recorded.

34. An apparatus according to claim 10, wherein said suppressing controlling means comprises a switch connected in parallel with said head coil and switched on and off by said recording signal and a resistance.

35. An apparatus according to claim 10, wherein said head coil comprises a plurality of head coil elements arranged in a radial direction of the recording medium.

36. An apparatus according to claim 35 wherein said plurality of head coil elements are used as selectively switched by a third switching means.

37. A magnetic head driving apparatus, comprising:
 a recording magnetic field generating means arranged opposite to a recording medium, having:
 a first magnetic field generating means having a series resonant circuit comprising a head coil arranged opposite to a side of said recording medium, and a first capacitor connected in series with said head coil,
 a driving signal feeding means producing an exciting signal synchronized with the resonant frequency of said series resonant circuit for feeding said series resonant circuit with said exciting signal to cause said series resonant circuit to generate a first magnetic field of said medium, and a suppressing controlling means connected to said series resonant circuit for selectively suppressing a resonant characteristic of said series resonant circuit in response to a recording signal corresponding to recorded information by selectively suppressing a current flowing through said head coil; and a second magnetic field generating means for generating a second magnetic field directed reversely to a direction of the first generated magnetic field.

38. An apparatus according to claim 37, wherein said suppressing controlling means comprises a switch connected in parallel with said electrostatic capacity and is switched on and off by said recording signal and a resistance.

39. An apparatus according to claim 37, wherein said apparatus further comprises a head coil moving means for moving said head coil in a radial direction of the recording medium.

40. An apparatus according to claim 37, wherein said second magnetic field generating means includes an permanent magnet arranged adjacent to said recording medium.

41. An apparatus according to claim 37, wherein said second magnetic field generating means includes an electromagnet arranged adjacent to said recording medium.

42. An apparatus according to claim 37, wherein said suppressing controlling means comprises a switch connected in parallel with said head coil and switched on and off by said recorded information and a resistance.

43. An apparatus according to claim 37, wherein said suppressing controlling means comprises a switch connected in parallel with said first capacitor and switched on and off by said recorded information and a resistance.

44. A magnetic head driving apparatus, comprising:
a recording magnetic head generating means arranged on a side of a recording medium, having:
a first magnetic field generating means having a series resonant circuit comprising a head coil and a first capacitor connected in series with each other, a direct current power source for providing power to said series resonant circuit through a first switching means, an inductor connected in parallel with said first capacitor, said inductor having an inductance significantly larger than an inductance of said head coil, second switching means provided in parallel with said head coil and said first switching means, and a control signal outputting means for controlling switching operations of said first and second switching means with a control signal which has a frequency which corresponds to a resonant frequency of the series resonant circuit; and
a second magnetic field generating means for generating a second magnetic field directed reversely to a direction of a magnetic field generated by said first magnetic field generating means.

45. An apparatus according to claim 44, wherein said first switching means comprises a first switching device to be switched.

46. An apparatus according to claim 44, wherein said second switching means comprises a second switching device to be switched.

47. An apparatus according to claim 44, wherein said first switching means comprises a first switching device to be switched and a first damping device connected in series with said first switching device and damping the resonance of said series resonant circuit.

48. An apparatus according to claim 44, wherein said second switching means comprises a second switching device to be switched and a second damping device connected in series with said second switching device and damping the resonance of said series resonant circuit.

49. An apparatus according to claim 47 or 48 wherein said control signal outputting means has a second control signal outputting means for outputting a second control signal switching on and off said second switching means with a frequency twice as large as of said series resonant circuit every half period of said twice frequency and a first control signal outputting means for outputting a first control signal switching off said first switching means which is on in said second control signal in response to a recording signal.

50. An apparatus according to claim 44 wherein said control signal outputting means outputs a first control signal switching on said first switching means for a period about ¼ the resonant period of said series resonant circuit and switching it off for other periods.

51. An apparatus according to claim 44 wherein said control signal outputting means controls switching on and off said second switching means with a second control signal made by turning said first control signal.

52. An apparatus according to claim 44 wherein said control signal outputting means has a second control signal outputting means for outputting a second control signal switching on said second switching means for a fixed period by a divalued control signal and a first control signal outputting means for outputting a first control signal switching on said first switching means for the period when said control signal is delayed and said second switching means becomes off.

53. An apparatus according to claim 44, wherein a second capacitor having a larger capacitance than the capacitance of said first capacitor is further interposed between a connecting point of said first capacitor and said head coil and a connecting point of said conductor and said second switching means.

54. An apparatus according to claim 44 wherein said control signal outputting means outputs a second control signal switching off said second switching means for a delaying time by a delaying means before the timing of switching on said first switching means through a turning means for turning said first control signal.

55. An apparatus according to claim 44, wherein said first capacitor comprises a plurality of condensers, and further comprising a switching means for switching the selection of said plurality of condensers, and a switching controlling means for selectively connecting said plurality of condensers in series with said head coil in response to recorded information.

56. An apparatus according to claim 44, wherein said head coil is formed of a plurality of head coil elements, wherein the recording medium has a rotational axis and a radial direction relative to the rotational axis, and said plurality of head coil elements are arranged in the radial direction of the recording medium.

57. An apparatus according to claim 56 wherein said plurality of head coil elements are used as selectively switched by a third switching means.

* * * * *